United States Patent
Xiao

(10) Patent No.: US 7,145,330 B2
(45) Date of Patent: Dec. 5, 2006

(54) SCANNING MAGNETIC MICROSCOPE HAVING IMPROVED MAGNETIC SENSOR

(75) Inventor: Gang Xiao, Barrington, RI (US)

(73) Assignee: Brown University Research Foundation, Providence, RI (US)

( * ) Notice: Subject to any disclaimer, the term of this patent is extended or adjusted under 35 U.S.C. 154(b) by 220 days.

(21) Appl. No.: 10/493,831

(22) PCT Filed: Aug. 14, 2003

(86) PCT No.: PCT/US03/25390

§ 371 (c)(1),
(2), (4) Date: Apr. 28, 2004

(87) PCT Pub. No.: WO2004/017102

PCT Pub. Date: Feb. 26, 2004

(65) Prior Publication Data

US 2004/0207396 A1    Oct. 21, 2004

Related U.S. Application Data

(60) Provisional application No. 60/403,966, filed on Aug. 16, 2002.

(51) Int. Cl.
*G01R 33/02*   (2006.01)
(52) U.S. Cl. .................... 324/244; 324/247; 250/306
(58) Field of Classification Search ............. 324/244, 324/247
See application file for complete search history.

(56) References Cited

U.S. PATENT DOCUMENTS

| | | | |
|---|---|---|---|
| 4,588,946 A | 5/1986 | Lin | 324/767 |
| 5,038,104 A | 8/1991 | Wikswo, Jr. et al. | 324/258 |
| 5,171,992 A | 12/1992 | Clabes et al. | 250/306 |
| 5,465,046 A | 11/1995 | Campbell et al. | 324/244 |
| 5,491,411 A | 2/1996 | Wellstood et al. | 324/248 |
| 5,508,517 A | 4/1996 | Onuki et al. | 250/306 |
| 5,543,988 A | 8/1996 | Brady et al. | 360/112 |
| 5,589,780 A | 12/1996 | Ueda et al. | 324/751 |
| 5,650,958 A | 7/1997 | Gallagher et al. | 5/127 |
| 5,652,445 A | 7/1997 | Johnson | 257/295 |
| 5,750,989 A | 5/1998 | Lindsay et al. | 250/306 |
| 5,793,743 A | 8/1998 | Duerig et al. | 369/126 |
| 5,834,938 A | 11/1998 | Odawara et al. | 324/248 |

(Continued)

OTHER PUBLICATIONS

S. Ingvarsson, et al.; "Electronic Noise in Magnetic Tunnel Junctions", American Institute of Physics, Journal of Applied Physics, vol. 85, No. 8, Apr. 15, 1999, pp. 5270-5272.

(Continued)

*Primary Examiner*—David A. Vanore
(74) *Attorney, Agent, or Firm*—Harrington & Smith, LLP

(57) ABSTRACT

A scanning magnetic microscope SMM (20) includes a sensor (10) for sensing a magnetic field generated by a specimen (78), the sensor including one of a MTJ, a GMR, or an EHE sensor; translation apparatus (22A–C, 52) for translating the sensor relative to a surface of sad specimen; and a data processor (50), having an input coupled to an output of said sensor, for constructing an image of said magnetic field. The sensor preferably includes one to three sensing units each defining a sensing axis for sensing a component of a magnetic field from a specimen, the sensing units disposed such that the sensing axes are orthogonal to one another. Pluralities of such sensors can be disposed in two or three dimensional arrays. The SMM can be used for examining the current flow in ICs, electromigration, magnetic data storage media, biomagnetic systems and magnetic ink used to print currency.

21 Claims, 19 Drawing Sheets

U.S. PATENT DOCUMENTS

| | | | | |
|---|---|---|---|---|
| 5,841,692 | A | 11/1998 | Gallagher et al. | 365/173 |
| 5,856,617 | A | 1/1999 | Gurney et al. | 73/105 |
| 5,862,022 | A | 1/1999 | Noguchi et al. | 360/324.2 |
| 5,966,012 | A | 10/1999 | Parkin | 324/252 |
| 6,005,753 | A | 12/1999 | Fontana, Jr. et al. | 360/324.2 |
| 6,118,284 | A | 9/2000 | Ghoshal et al. | 324/750 |
| 6,150,809 | A | 11/2000 | Tiernan et al. | 324/238 |
| 6,165,287 | A | 12/2000 | Sato et al. | 148/276 |
| 6,237,399 | B1 | 5/2001 | Shivaram et al. | 73/105 |
| 6,266,218 | B1 | 7/2001 | Carey et al. | 360/324.12 |
| 6,297,630 | B1 | 10/2001 | Dietzel et al. | 324/210 |
| 6,396,261 | B1 | 5/2002 | Martchevskii et al. | 324/235 |
| 6,448,766 | B1 | 9/2002 | Berger et al. | 324/244 |
| 6,495,275 | B1 | 12/2002 | Kamiguchi et al. | 428/692 |
| 6,657,431 | B1 | 12/2003 | Xiao | 324/244 |
| 6,696,833 | B1* | 2/2004 | Hong et al. | 324/244 |
| 6,717,402 | B1* | 4/2004 | Mukasa et al. | 324/252 |
| 6,809,516 | B1* | 10/2004 | Li et al. | 324/260 |
| 6,817,231 | B1* | 11/2004 | Yasutake et al. | 73/105 |
| 6,822,443 | B1* | 11/2004 | Dogaru | 324/235 |
| 6,917,198 | B1* | 7/2005 | Johnson et al. | 324/251 |
| 6,930,479 | B1* | 8/2005 | Xiao et al. | 324/262 |
| 6,933,717 | B1* | 8/2005 | Dogaru et al. | 324/239 |
| 6,943,574 | B1* | 9/2005 | Altmann et al. | 324/754 |
| 6,947,788 | B1* | 9/2005 | Gilboa et al. | 600/435 |
| 2003/0076094 | A1* | 4/2003 | Hoshino | 324/247 |

OTHER PUBLICATIONS

Daniel S. Reed, et al.; "Low Frequency Noise in Magnetic Tunnel Junctions", IEEE Transactions on Magnetics, vol. 37, No. 4, Jul. 2001, pp. 2028-2030.

S. Ingvarsson, et al.; "Low-Frequency Magnetic Noise in Micron-Scale Magnetic Tunnel Junctions", The American Physical Society, Physical Review Letters, Oct. 9, 2000, vol. 85, No. 15, pp. 3289-3292.

Michael K. Ho, et al.; "Study of Magnetic Tunnel Junction Read Sensors", IEEE Transactions on Magnetics, vol. 37, No. 4, Jul. 2001, pp. 1691-1694.

Jian Qing Wang, et al.; "Large finite-size effect of giant magnetoresistance in magnetic granular thin films", Physical Review B (Condensed Matter), vol. 51, No. 9, Mar. 1995(Abstract).

B.L.T. Plourde, et al.; "Design of a Scanning Josephson Junction Microscope for Submicron-Resolution Magnetic Imaging", Review of Scientific Instruments, vol. 70, No. 11, Nov. 1999, pp. 4344-4347.

S.Y. Yamamoto, et al.; "Scanning Magnetoresistance Microscopy", American Institute of Physics, Applied Physics Letters, 69, (21), Jun. 10, 1996, pp. 3263-3265.

E.R. Norwak, et al.; "Noise Properties of Ferromagnetic Tunnel Junctions", American Institute of Physics, Applied Physics Letters, vol. 84, No. 11, Dec. 1, 1998, pp. 6195-6201.

http://www.neocera.com/html-files/magma/magma.htm, Unprecedented Accuracy in Location of buried Faults, Oct. 30, 1999, Neocera.

Honeywell Sensor Products 1-and 2-Axis Magnetic Sensors HMC1001/1002 HMC1021/1022, 900248 Rev. B, Apr. 2002.

Honey Well Sensor Products Three Axis Magnetic Sensor Hybrid HMC2003, 900151 Rev. C, Oct. 1997.

* cited by examiner

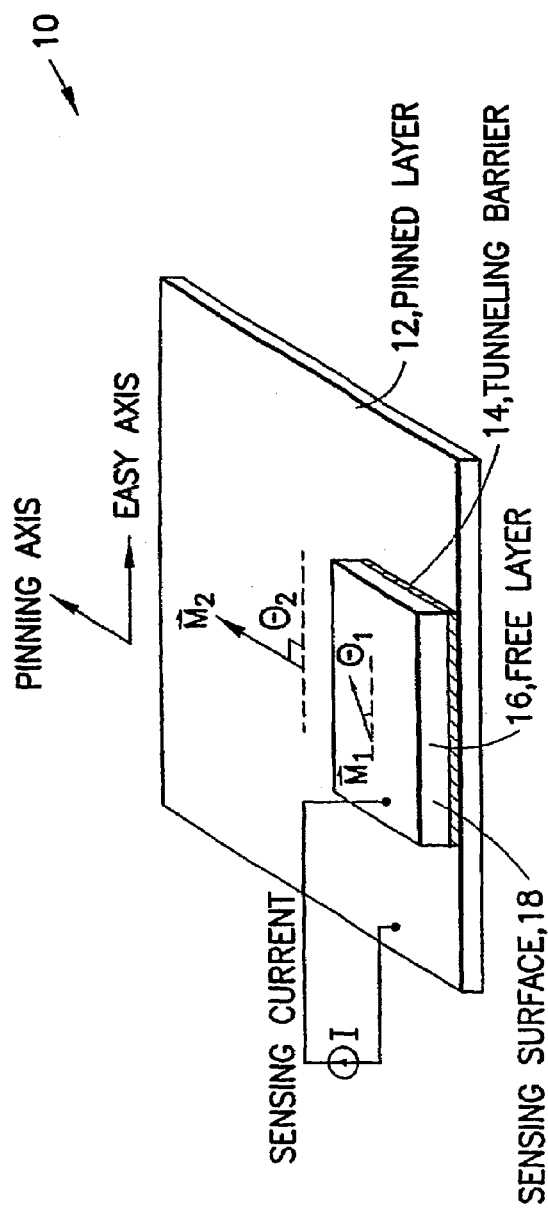

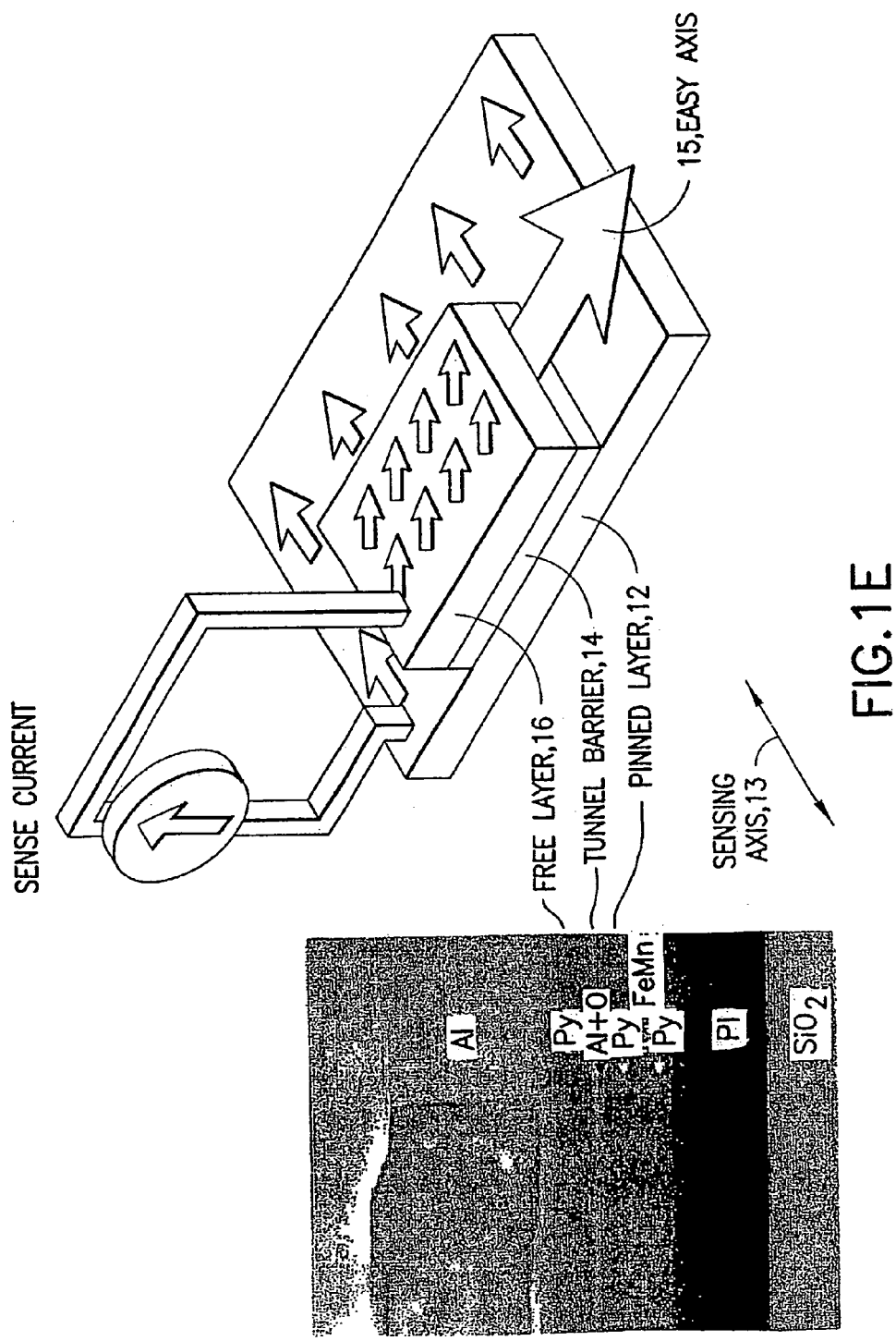

OPTICAL MICROSCOPE IMAGE (75x200 μm)

OPTICAL MICROSCOPE IMAGE (220x1000 μm)

CURRENT DENSITY MAP

MAGNETIC FIELD IMAGE

MAGNETIC FIELD IMAGE

CURRENT DENSITY MAP

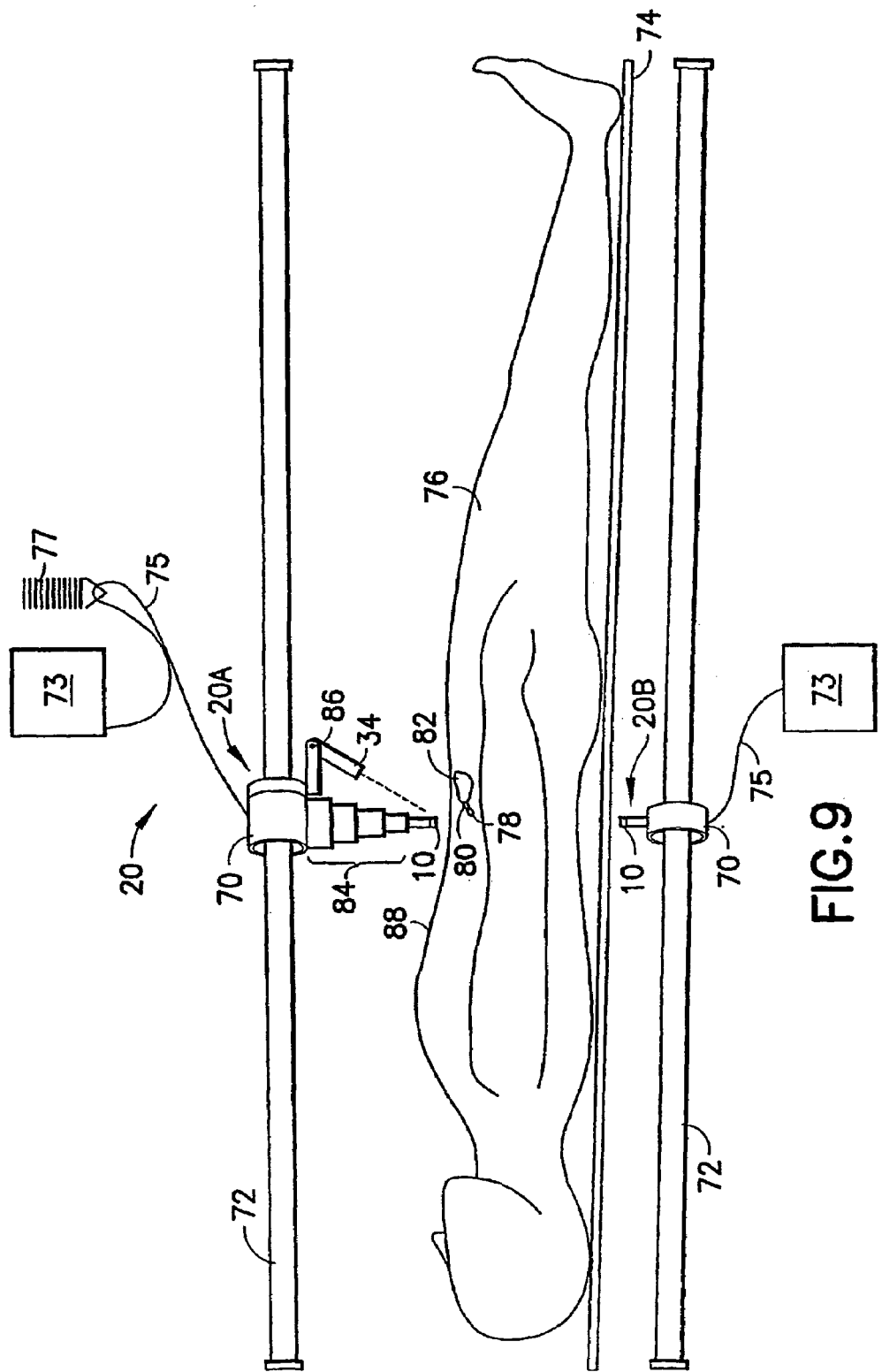

SCANNING MAGNETIC MICROSCOPE HAVING IMPROVED MAGNETIC SENSOR

PRIORITY STATEMENT

This application claims priority to International Patent Application No. PCT/US03/25390, filed on Aug. 14, 2003, and to U.S. Provisional Patent Application No. 60/403,966, filed on Aug. 16, 2002, through the referenced PCT application.

This application claims priority from Provisional U.S. Patent Application No. 60/403,966, filed on Aug. 16, 2002, incorporated herein by reference.

TECHNICAL FIELD AND INDUSTRIAL APPLICABILITY

This invention pertains to a high resolution and sensitive magnetic microscope using one of a plurality of different magnetic sensor types, including a magnetic tunneling junction, a giant-magnetoresistive spin valve, and an extraordinary Hall effect sensor. Suitable applications for the magnetic microscope include failure analysis/fault isolation/inspection of semiconductor integrated circuit (IC) and magnetic data storage, manufacturing monitoring, detecting and quantifying biological agents using magnetic tags, and other biological, chemistry, physics, and materials research applications.

BACKGROUND

The need for sensitive magnetic microscopes with a high degree of spatial resolution is felt in many industries. For example, IC engineers and designers can use such a microscope to carry out non-invasive and non-destructive measurements of electrical current distributions within an IC chip, and they may survey the operation of tiny devices—pinpointing electrical and structural defects down to the smallest unit (transistor, diode, interconnects, vias, etc.). They may also study electro-migration of interconnects to develop even finer conducting lines. In another application, a data-storage professional can image ultrafine domain structures of future recording media with a magnetic microscope of sufficient sensitivity and resolution. These media will have an increasingly small domain size, eventually approaching the adverse superparamagnetic limit. Furthermore, the magnetic microscope is also applicable to a range of basic research areas, such as flux line structure investigation.

Many physical objects generate magnetic fields (H) near the objects' surfaces, and the magnetic microscope can obtain images of the magnetic fields by scanning a magnetic sensor on the surface of the object of interest. Such images can be spatially microscopic and weak in field strength. Nevertheless, these images reveal important signatures of inherent electrical and magnetic processes within the objects. For example, the magnetic image of a magnetic thin film discloses its internal magnetic domain structure (spatial electron-spin configuration). The electrical currents within an integrated circuit (IC) chip generate external magnetic images, which not only contain information of current-distribution, but also the frequencies with which various components on a chip are operating. A type II superconductor also creates an image of threading magnetic flux lines, whose structure and dynamics are fundamental properties. Researchers have confirmed the d-wave symmetry in high-$T_c$ superconductors by studying the flux line images in a uniquely designed sample.

There are currently a number of techniques for imaging magnetic fields at surfaces.

Electron holography and SEMPA (scanning electron microscopy with polarization analysis) require high vacuum operation and delicate sample preparation. Both techniques offer static field images with good spatial resolution. However, these instruments are expensive and demand great technical skill to operate.

The magneto-optical microscope is a relatively simple system and is suitable for time-resolved imaging. However its field sensitivity and spatial resolution are poor.

The conventional scanning magnetic microscope has a microscopic field sensor, typically a superconducting quantum interference device (SQUID), a Hall probe, or simply a magnetic tip. This type of microscope scans the magnetic sensor relative to a sample to obtain a local field image. Though very sensitive, a SQUID probe is poor in resolution (~5 μm), and requires cryogenics (77K). A Hall probe can operate under ambient conditions, but its sensitivity in the prior art is low. The magnetic microscope equipped with a magnetic tip can only measure the gradient of the magnetic field, and cannot sense a high frequency signal (e.g. MHz-GHz).

Prior to this invention the conventional magnetic imaging systems, such as the conventional scanning magnetic microscope, suffered from at least one of an inadequate sensitivity or an inadequate spatial resolution, resulting in the generation of magnetic field images that were less than optimum.

DISCLOSURE OF THE INVENTION

An aspect of this invention lies in the adaptation of high-performance magnetic sensors, for example, the magnetic tunneling junction (MTJ), as the sensing element for a magnetic microscope. MTJ sensors are superior to other existing sensors for many applications. The microscope equipped with such a sensor offers excellent field-sensitivity and spatial resolution, and affords new abilities in the design and characterization of modem semiconductor chips and data storage media. The magnetic microscope operates over a wide signal frequency range (DC to several gigahertz), at room temperature and ambient pressure, offering cost-effective turnkey convenience.

In one aspect of the invention, at least two magnetic sensing units that each define a high-resolution (HR) axis are mounted such that their HR axes are orthogonal to one another. This orthogonal dual-sensor enables high spatial resolution (10–20 nm) in the two dimensional scanning area (x-y plane).

In another aspect of the invention, three magnetic sensing units that each measures one component ($B_x$, $B_y$, and $B_y$) of the magnetic field vector (B) are closely mounted on the probe of the microscope. This vector sensing capability provides current density distribution in a three dimensional circuit.

These teachings provide in another aspect a scanning magnetic microscope with a magnetic-tunneling-junction (MTJ) sensor. This is a type of magneto-resistive sensor with both a high field-sensitivity and spatial resolution. The microscope operates under ambient conditions. Other types of magnetic sensors, such as giant-magnetoresistive (GMR) spin valves and extraordinary Hall effect (EHE) sensors, can also be used.

The scanning magnetic microscope may be equipped with any of three types of magnetic sensors: MTJ, GMR and EHE. The scanning magnetic microscope measures a spatial magnetic field generated on the surface of a sample, such as an electrical circuit or a magnetic data storage media. The scanning magnetic microscope may also measure such a field generated from a surface of or from within a biological sample containing tags of small magnetic particles, and may also convert a measured magnetic field map into an electrical current density map. The scanning magnetic microscope may be used to obtain the electrical current distribution in an integrated circuit network, or in a planar magnetic structure, with or without physically contacting the surface.

Since the GMR, MTJ or EHE sensors of this invention operate preferably with a sensing element containing a single magnetic domain, the size of a sensor may be accordingly small, with sensing area below 20×200 nanometer, and they may operate with frequencies of a gigahertz or greater, so that the system responds to electrical currents in that frequency range. This high frequency response permits examination of phenomena that cannot be studied with magnetic sensors having a lower frequency response. The GMR, MTJ, or EHE sensors can also operate at low frequencies such as DC. Within DC to several gigahertz, change of sensor is not needed.

The scanning magnetic microscope may be used to measure the electromigration of fine electrical interconnects. As the width of the interconnects becomes finer (e.g, less than about 0.10 micron), the electrical current density in the interconnects can displace atoms away from their equilibrium positions and eventually cause the interconnects to break. With the scanning magnetic microscope one may observe how the interconnects are broken gradually under various types of conditions (e.g. elevated temperature, large current density, aging, material composition, overlay, edge roughness, etc.). Using the scanning magnetic microscope one may observe the electrical current distribution of interconnects that are embedded within dielectrics. Other microscope types, such as the scanning electron microscope, cannot see embedded interconnects. An important, but not limiting, application of the scanning magnetic microscope is thus in non-destructively inspecting integrated circuits, as well as in investigating the electromigration mechanism.

Since a sensor cannot resolve spatially a disturbance that is smaller than the sensor, it is an advantageous feature of the invention that the sensor dimensions can be much less than one micron (on the order of a few nanometers), and that the sensor may be controlled to follow the contours of the specimen closely. This last feature is especially useful in studying a specimen such as an integrated circuit (IC) that has many steps up and down on its surface due to the presence of surface features. A single sensor along the direction of translation, or a plurality of sensors along and/or across the direction of translation, can be 'stepped' as they translate relative to a surface of the IC.

The conventional scanning SQUID (superconducting quantum interference device) microscope operates at low temperature (77K) and has poor spatial resolution to image room temperature objects. The scanning magnetic microscope in accordance with these teachings may operate under ambient temperature conditions (e.g., T about 300K or higher), and may achieve a spatial resolution as small as 0.02 microns.

A multilayer sensor 10 according to one aspect of the present invention is shown in FIG. 1A, wherein a tunneling barrier 14 is sandwiched between a pinned layer 12 and a free layer 16. A sensing current is applied across the pinned 12 and free 16 layers so that a sensing surface 18 may sense one component (perpendicular to the easy axis) of a magnetic field vector (B) resulting from an excitation current applied to a specimen. Alternatively, the sensor 10 may sense a magnetic field emanating from a magnetic specimen without the application of an excitation current, depending upon characteristics of the specimen. Additional layers may be added, and/or each of the layers already described may themselves comprise a multilayer structure to enhance advantageous qualities as described herein.

The extraordinary Hall effect (EHE) sensor is a four terminal sensor, with two terminals for electrical current, and two terminals for measuring the Hall voltage, which is proportional to the external magnetic field to be measured. The sensing surface faces a surface of the specimen and the sensing current direction is either parallel or perpendicular to the translation direction. Advantageous composition of an extraordinary Hall sensor is $Fe_xPt_{100-x}$, or $Co_xPt_{100-x}$, and other associated alloys, wherein the electron spin-orbit coupling is strong.

MTJ, GMR, and EHE sensors and arrays of these sensors can be used as biomagnetic sensor arrays and used as analytical devices for detecting biological agents (e.g., antigens and antibodies) that are specifically attached to small magnetic particles. To enable detection, magnetic entities are engineered to attach to specific biological sites of interest. Typically, a nanoscale or micron-scale magnetic particle or wire is coated with one or more active biological molecules. The engineered particles serve as magnetic tags, allowing physicians and scientists to track the biological site of interest associated with a particular version of the tag. By detecting the magnetic moment and the motion of the tags, scientists can deduce the type of biological sites of interest involved and pinpoint their locations and motions.

Magnetic images may be obtained in either a contact mode (sensor contacting the surface) or in a non-contact mode wherein the sensor 10 is spaced from a surface of the specimen. The magnetic field spatial profile may be determined in three dimensions by knowing the spacing or height between the sensor and the surface of a sample. This height information is useful in accurately calculating the magnitude of the current density.

A scanning magnetic microscope can include a specimen stage for holding a specimen to be examined; a sensor for sensing a magnetic field generated by the specimen, the sensor including one of a magnetic tunneling junction sensor, a spin valve sensor, or an extraordinary Hall effect sensor; and translation apparatus for translating the sensor relative to a surface of said specimen. Additionally, a data processor, having an input coupled to an output of said sensor, may be coupled to the scanning magnetic microscope for constructing an image of said magnetic field. In another embodiment a GMR read/write head from a hard disk drive is shown to make a suitable magnetic sensor. The scanning magnetic microscope can be used for examining the current flow in integrated circuits and related phenomenon, such as electromigration, as well as magnetic data storage media and biomagnetic systems, to mention a few suitable applications.

A microscope with the sensitivities described herein can be used to detect and preferably quantify specimens within a biological host such as a living human or animal. The specimens are ingested or injected into the host, and subsequently selectively bind to a cancer cell, virus, or other biological sites of interest, or move around inside the host. One or more such microscopes may qualitatively detect and preferably also quantitatively measure concentrations of the specimens, from which presence, three dimensional location, movement trajectory, and concentration of the biological sites of interest to which they are bound may be deduced.

BRIEF DESCRIPTION OF DRAWINGS

The foregoing and other aspects of these teachings will be described in detail in conjunction with the attached Drawings. FIGS. 1, 2A–2C, 3A, and 4–8C are taken from FIGS. 1, 2A–2C, 3 and 4–8C, respectively, of U.S. patent application Ser. No. 09/875,436, which is incorporated by reference above.

FIG. 1A is a diagram of a magnetic tunneling junction field sensor.

FIG. 1E is a TEM micrograph of a MTJ sensor and a schematic of the sensor similar to FIG. 1A.

FIGS. 2A–2C show Equations that are referred to in the specification;

FIG. 3A shows a simplified block diagram of a Scanning Magnetic Microscope (SMM) that is constructed in accordance with these teachings;

FIG. 4 is a block diagram of electronic circuitry of the SMM of FIG. 3A;

FIG. 5 is an example of magnetic images obtained from the magnetic stripe of an identification card using the SMM of FIGS. 3A and 4;

FIG. 6 is a logic flow diagram of an algorithm used when generating the magnetic images of FIG. 5;

FIG. 8C is the corresponding current density map; and FIG. 9 is an embodiment of the Scanning Magnetic Microscope used for sensing a specimen bound to a biological site of interest within a biological host.

MODES FOR CARRYING OUT THE INVENTION

Figure 1B:
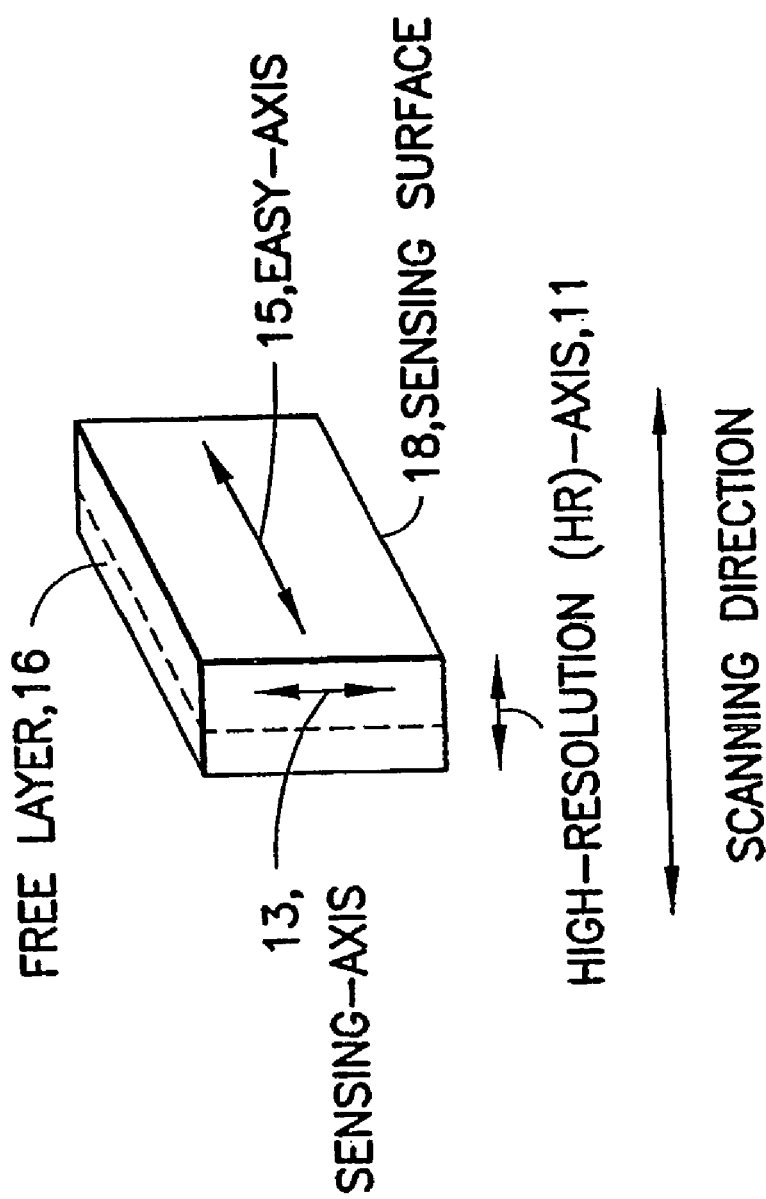
FIG. 1B is a diagram of a free layer in a MTJ or GMR sensor. Three axes are defined in the diagram.

The present invention incorporates material detailed in allowed but not yet issued U.S. patent application Ser. No. 09/875,436 filed on Jun. 6, 2001 (priority date Jun. 6, 2000) and entitled "Scanning Magnetic Microscope Having Improved Magnetic Sensor". The present invention also incorporates material detailed in International Patent Application No. PCT/US03/06793 filed on Mar. 7, 2003 (priority date Mar. 8, 2002) and entitled "High Resolution Scanning Microscope Operable at High Temperature; U.S. patent application Ser. No. 10/105,831 filed on Mar. 25, 2002 and entitled "Reduction of Noise, and Optimization of Magnetic Field Sensitivity and Electrical Properties in Magnetic Tunnel Junction Devices"; and U.S. patent application Ser. No. 10/371,321 filed on Feb. 21, 2003 and entitled "Extraordinary Hall Effect Sensors and Arrays".

Each of the above patent applications is incorporated by reference in their entirety.

A description will first be provided of various embodiments of magnetic field sensors, followed by a description of the various embodiments of the scanning magnetic microscope (SMM).

When subject to an external magnetic field, a metal suffers a change in its electrical resistivity. The relative resistance change is called magnetoresistance (MR), defined as $$\Delta R/R = [R(B) - R(0)]/R_s \qquad (1)$$

where $R(B)$, $R(0)$, and $R_s$ are resistance values, at a field B, at zero field, and at saturation field, respectively. This property has been used to sense a magnetic field by measuring resistance change in a field. In general, a good magnetoresistive sensor is characterized by a large MR value achieved at a small saturation field. Normal metals, such as copper, have small MR values, typically, a fraction of a percent even at Tesla fields. A magnetic Permalloy ($Ni_{79}Fe_{21}$) film has a moderate MR value of 2–3% at a few Oe, making it adequate for read/write heads in data storage devices. The physical mechanism in Permalloy, called anisotropic magnetoresistance (AMR), is originated from the electron spin-orbit interaction.

Since the discovery of the giant magnetoresistance (GMR) effect in the mid-1980s, a new area of research, referred to as spintronics, has been developed. The electron spin, coupled with the electron charge, plays an increasingly important role in device functions. The state-of-the-art GMR sensors are made of certain thin-film multilayers. They display large MR at low fields and at room temperature. A commercial multilayer structure (Permalloy/Cu/Co), known as a spin-valve, has a MR value of 9% at 1 Oe (about twice of the earth field). The GMR phenomenon is due to the spin-dependent scattering of conduction electrons off magnetic layers.

One disadvantage of GMR sensors is that these metallic structures are inherently highly conductive. A large electrical current is required to generate a sufficient signal. The total resistance depends on sensor dimensions. However, the length of a sensor cannot be made too small or the electrical signal becomes weak. This places a limitation on the miniaturization of GMR sensors. Another disadvantage is that the MR value for GMR sensor is only moderate (~10%). For magnetic data storage application where the magnetic field strength is tens to hundreds of Oe, GMR sensors are adequate in sensitivity.

Magnetic tunneling junctions (MTJs) first emerged in 1995 as another source of large magnetoresistance. MTJ devices have demonstrated a number of technical advantages over the existing GMR devices. The MTJ structure is a sandwich (metal/insulator/metal) with two ferromagnetic metallic layers (top and bottom electrodes) separated by a thin insulating barrier. The tunneling resistance depends on the relative orientation of the magnetization vectors (M) in the two ferromagnetic metal layers. The magnetotunneling effect exploits the asymmetry in the density of states of the majority and minority energy bands in a ferromagnet. The larger the asymmetry, the larger the spin polarization, and the larger the magnetotunneling effect.

When the M vectors are parallel in the two magnetic electrodes, there is a maximum match between the numbers of occupied states in one electrode and available states in the other. The electron tunneling current is at maximum and the tunneling resistance (R) minimum. On the other hand, in the antiparallel configuration, the electron tunneling is between majority states in one electrode and minority states in the other. This mismatch results in a minimum current and a maximum resistance. Since the directions of magnetizations M can be altered by an external field, the tunneling resistance is sensitive to the field. According to the Julliere Model of magnetotunneling, the maximum MR ratio between parallel and antiparallel configurations is:

$$\Delta R/R = (R_{parallel} - R_{antiparallel})/R_{parallel} = 2P_1P_2/(1-P_1P_2)$$

where $R_{parallel}$ and $R_{antiparallel}$ are the resistances of the junction corresponding to the parallel and antiparallel states, respectively, between the two ferromagnetic electrodes; $P_1$ and $P_2$ are the spin-polarization factors of the two electrodes. For a transition ferromagnetic metal (Co, Fe, Ni, and their alloys), P is in the range of 20–40%, leading to $\Delta R/R$ being approximately 12%–67%.

MTJs offer a number of significant advantages as spintronic devices. The advantages include the following. First, the junction resistance (R) can be varied easily over a wide range ($10^{-3}$–$10^8$ Ohm), while keeping intact the large MR ratio. The value of R depends on barrier thickness (t ~0.5–2 nm) exponentially and on junction area (A) inversely. The ability to tailor R in MTJ to suit electronics surpasses that in GMR devices. Second, the MTJ can be miniaturized to nanometer size while retaining the large MR ratio and an adequate resistance, since R is primarily sensitive to barrier thickness. This property, not available in GMR spin-valves, is particularly important for high-resolution field imaging. Third, MTJ devices can operate in a very large frequency range (0–10 GHz) with excellent frequency response. Hence such sensors can provide dynamic magnetic images, revealing not only physical defects, but also digital/analog defects of ICs. Fourth, the MTJ is a simple two-terminal resistive device, requiring only small current density to operate. The stray field generated by the sensing current is small. Fifth, the MTJ devices have much larger MR ratio than commercial GMR spin valves at comparable fields. For example, (Fe—Ni)/$Al_2O_3$/Co junctions exhibit a MR ratio of 28% at a few $Oe^5$, whereas a commercial (Fe—Ni)/Cu/Co GMR sensor has a MR of 9%.

A discussion is now made of the fabrication of a MTJ sensor for use in a magnetic microscope.

Two requirements for a magnetic sensor are linear field response and wide signal dynamic range. Magnetic interlayer coupling inherent in any MTJ can adversely affect both of these requirements, if not properly addressed. To understand the issues involved, consider the construction of a MTJ sensor 10 as shown in FIG. 1A. The MTJ sensor 10 includes a pinned layer 12, a tunneling barrier 14, a free layer 16 and a sensing surface 18. In the absence of a signal field, the magnetic moment vector ($M_1$) of the ferromagnetic free layer 16 (the top electrode) aligns along the easy-axis 15 ($\theta_1=0$) of the electrode. $M_1$ is allowed to rotate, i.e., changing $\theta_1$, in response to signal fields. The moment vector ($M_2$) of the bottom electrode, or the pinned layer 12, is fixed at $\theta_2=90°$ by exchange coupling with an antiferromagnetic layer, such as FeMn. According to the theory of magnetotunneling, the resistance response of the MTJ sensor 10 to signal field (H) is given by:

$$\Delta R \sim \cos(\theta_1 - \theta_2) = \sin\theta_1 \sim \theta_1 \sim H. \qquad (2)$$

Therefore, an ideal MTJ sensor yields a linear field response near the quiescent state ($\theta_1=0$). When the free layer 16 $M_1$ is driven close to saturation by signal fields, i.e., when $\theta_1$ approaches ±90°, the linearity will fail. To maximize the dynamic range, it is important to keep $M_1$ along the easy-axis 15 ($\theta_1=0$) in zero external field. However, the maintenance of this quiescent state is complicated by the existence of three internal forces that can cause $M_1$ to deviate from the equilibrium direction.

Magnetostatic coupling results from the magnetic poles near the edges of the pinned layer 12. This field is significant for micron-size sensors, and it depends on the thicknesses, dimensions, and separation of the electrodes. Magnetostatic coupling favors antiparallel alignment between the moments of the free layer 16 and the pinned layer 12.

Néel coupling, also referred to as "orange-peel" coupling from the texture of an orange peel, originates from the ripples, or surface roughness, of the pinned layer 12. The uneven layer thickness creates uncompensated dipoles, leading to local fields near the free layer 12. The strength of this coupling depends on the amplitude and the characteristic wavelength of the surface roughness, and on the interlayer separation. Because of the thin tunnel barrier, this coupling is significant for the MTJ sensor 10. The "orange-peel" coupling favors parallel alignment between the moments of the free layer 16 and the pinned layer 12.

The sensing current I also generates an unwanted field. One advantage of MTJ sensors over GMR spin-valves is that the sensing current I is much smaller, due to the high resistance of the MTJ sensor 10. Therefore, this field is of less concern.

The balancing of these three forces is an important task for the proper operation of the MTJ sensor 10. The key is to achieve quiescent state of the sensor 10 at the center of the linear response region, for maximum signal dynamic range.

In Néel's model, a sinusoidal roughness profile is assumed, and the "orange-peel" coupling field is given by the expression shown in FIG. 2A, where h and λ are the amplitude and wavelength of the roughness profile, $t_F$ and $t_s$ are the thickness of the free layer 16 and that of the barrier 14, and $M_S$ is the magnetization of the free layer 16. In samples with various $t_s$ and $t_F$, we have found that experimental data are accounted for by the equation shown in FIG. 2A. The obtained roughness amplitude (h) and wavelength (λ) are listed the Table below (the method of transport means that the results are obtained using electrical transport measurement, VSM is the method of vibrating sample magnetometer, and TEM is the method of transmission-electron-microscopy).

| Method | h (Å) | λ (Å) |
| --- | --- | --- |
| transport | 7.3 +/− 0.5 | 94 +/− 15 |
| VSM | 7.1 +/− 0.3 | 100 +/− 10 |
| TEM | 10.1 +/− 3.8 | 101 +/− 8 |

In addition to Néel coupling, there is yet another interlayer coupling due to the stray polar magnetostatic fields ($H_M$) from the edges of the pinned magnetic electrode. In contrast to Néel coupling, polar field coupling is dependent on junction size and shape. This property enables one to use an adequate geometrical parameter to create a stray-field for compensating the Néel coupling. Experimental results and computer simulations have shown that, for a preferred sample geometry, the stray-field coupling field is given by:

$$H_M = AW^\alpha/L, \quad (3)$$

where W and L are the sample width and length in microns, A is a constant and the exponent $\alpha$ is 0.22. The value of $\alpha$ is found to be dependent on sample dimensions; in the limit where the separation between the free layer 16 and the relevant pinned layer 12 is much larger than its width, the value of $\alpha$ approaches one, whereas in the opposite limit, the value of $\alpha$ should be nearly zero. Therefore, the width dependence of the offset field becomes more prominent (larger $\alpha$) as the lateral dimension of the MTJ 10 decreases.

The total offset field is the superposition of $H_N$ and $H_M$. $H_N$ and $H_M$ differs in sign. Therefore when the magnitudes of $H_N$ and $M_M$ are equal to each other, the total offset field is zero, providing maximum dynamic range. Because of the weak dependence on the width, one can rewrite Equation 3 as:

$$H_M = B/L + \in(W), \quad (4)$$

where L and W are the sample length and width in microns, B is the magnetostatic coupling constant, in G-µm. The term $\in(W)$ is generally small compared to the overall magnetostatic coupling (no more than 10% over a large range of widths) and represents the width dependence of the magnetostatic coupling. The Equations shown in FIG. 2A, and Equation 4 form the basis of the design rules to zero the internal coupling fields in MTJ sensors.

For magnetic microscopes and for other magnetic field sensing applications, the following MTJ layer structures may be employed to obtain low magnetic noise and compensated internal magnetic coupling.

One suitable embodiment of a magnetic tunnel junction (MTJ) sensor has the following layer structure: Si wafer or Si wafer coated with $SiO_2$/60 Ta/300 Al/40 $Ni_{79}Fe_{21}$/x Cu (x: 0–100)/100 PtMn/(P2) Co/7 Ru/(P1) Co/y $Al_2O_3$ (y: 3–20)/10 Co/70 $Ni_{79}Fe_{21}$/250 Al/75 Ta. The number associated with each layer is the thickness in Angstrom. For this structure, the PtMn is the antiferromagnetic (AFM) 'pinning' layer 12, the Co/Ru/Co tri-layer serves as the pinned electrode and the 10Co/70 $Ni_{79}Fe_{21}$ layer functions as the 'free' electrode 16. The layer of Ru between the two Co layers (P1 and P2) has the effect of antiferromagnetically biasing these two layers through interlayer exchange. Magnetic tunneling occurs between the two Co layers, which are adjacent to the $Al_2O_3$ barrier. The pinned tri-layer Co/Ru/Co, because of its AFM ordering, substantially reduces the polar magnetostatic field. By properly selecting the thicknesses of P1 and P2, one can balance the polar field and the Néel coupling. The free bi-layer (10 Co/70 $Ni_{79}Fe_{21}$) is dominated by the Permalloy and, therefore, is 'soft' magnetically. However, magnetic tunneling occurs between two adjacent Co layers that have high magnetic ordering temperature and magnetic thermal stability. This embodiment has the benefits of low magnetic noise due to reduced magnetic fluctuations and of compensated magnetic internal coupling. The antiferromagnetic PtMn layer can be replaced with, by example, FeMn or IrMn antiferromagnetic films.

The Cu layer is used to improve the growth of the PtMn layer and to improve the exchange bias. An improved exchange bias enhances the magnetic stability of the sensor. The 10 Angstrom Co layer is used to improve magnetic stability, thereby reducing magnetic field noise. The magnetization of the pinned layers 12 and the free layers 16 are perpendicular to one another. The (P2)Co/7Ru/(P1)Co sequence is used to compensate the Néel coupling field, so that the magnetic offset field is zero in the sensor. A zero offset field increases the field dynamic range of the sensor.

Another suitable magnetic tunneling junction (MTJ) multilayer structure has the form of Si wafer/$SiO_2$/Pt (30 nm)/Py(x)/FeMn (13 nm)/Py (6 nm)/$Al_2O_3$ (0.5–2.5 nm)/Py (12 nm)/Al (49 nm). The seed layer Py (x) is either $Fe_{79}Ni_{21}$ (permalloy) with a thickness x between 2 to 10 nm, or Cu (1.5 nm)/Py (x) with x between 2 to 9 nm. The buffer layer Pt (30 nm) can be replaced by Ta (5 to 10 nm). In accordance with this layer sequence a magnetoresistance value that is as large as 38% has been observed. Transmission-electron-micrographs of the cross section of the MTJ multilayer structure show high quality smooth and pin-hole free layer structures, as shown in FIG. 1B.

Transmission-electron-micrographs of the cross section of these MTJ multilayer structures show high quality smooth and pin-hole free layer structures. The two structures described above are described in more detail, and their advantages are quantified, in allowed U.S. patent application Ser. No. 09/875,436, incorporated by reference above.

The MTJ sensor 10 may be grown via sputtering on a Si wafer and patterned using optical and/or electron-beam lithography. The resolution of the magnetic microscope is limited primarily by the size of the oval shaped free magnetic electrode 16 (i.e. the 10 Co/70 $Ni_{79}Fe_{21}$ layer). For applications where spatial resolution is not critical, the more economical optical lithography process can be used. Optical lithography provides good resolution down to about 0.1 micron. This type of magnetic sensor can be used to image the electrical current distribution of printed circuit boards, interconnects and other smaller features on IC chips. On the other hand, imaging the smallest device features in future ICs may require a magnetic sensor with a physical dimension less than 0.1 micron. Electron-beam lithography is appropriate for use in this case, as smaller spatial features can be defined.

The Si wafer containing processed MTJ sensor(s) is diced and polished into individual sensors or sensor arrays. A sensor in the microscope may contain multiple MTJ sensor units for different functionalities. We list a few examples as follows. FIG. 1B shows an individual sensor (MTJ or GMR). The shortest axis depicted is the high-resolution (HR) axis 11. The longest axis depicted is the magnetic easy axis 15, and the middle one is the sensing axis 13. Only the field component along the sensing axis 13 can be measured, so the individual sensing unit can sense one magnetic field component. Highest resolution images are obtained when the sensing unit is moved along the direction of the HR axis 11 (e.g., the x axis), and the only field component measured is parallel to the sensing axis (e.g., the z axis).

Figure 1C:
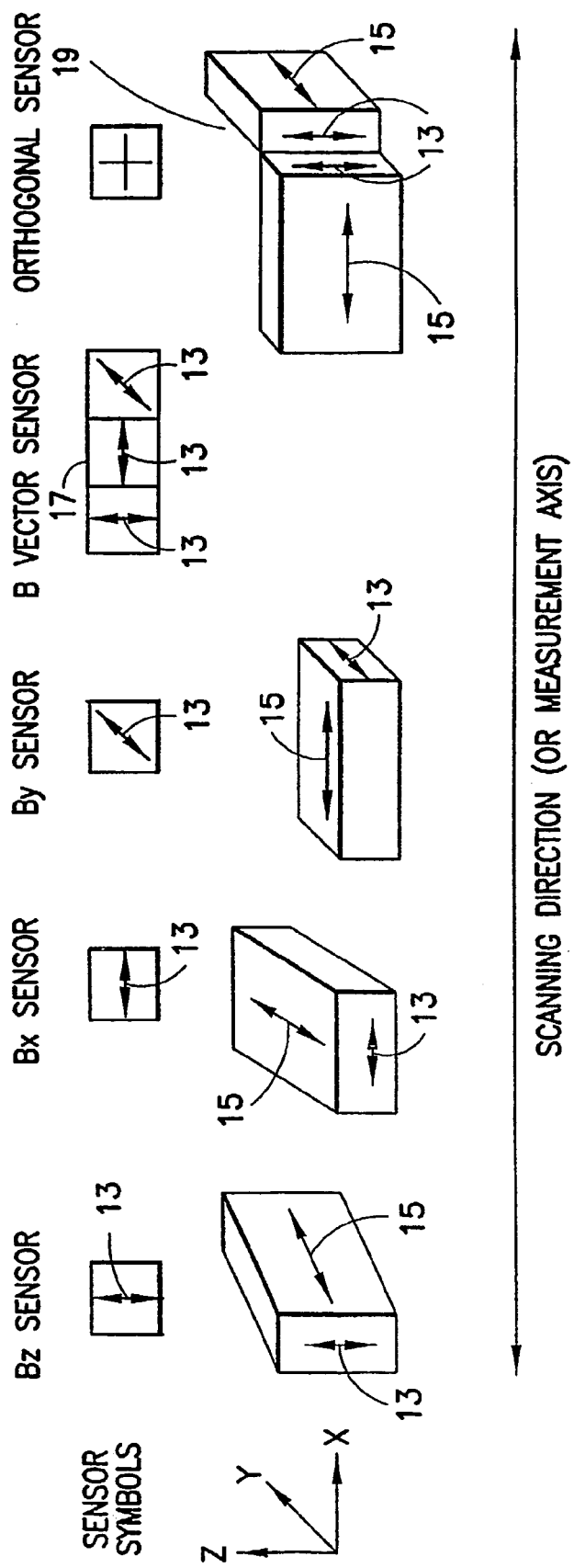
FIG. 1C shows a B vector sensor which consists of three sensor units, each measuring a particular magnetic field component FIG. 1C also shows an orthogonal sensor which consists of two sensor units orthogonal to each other as shown.
Figure 1D:
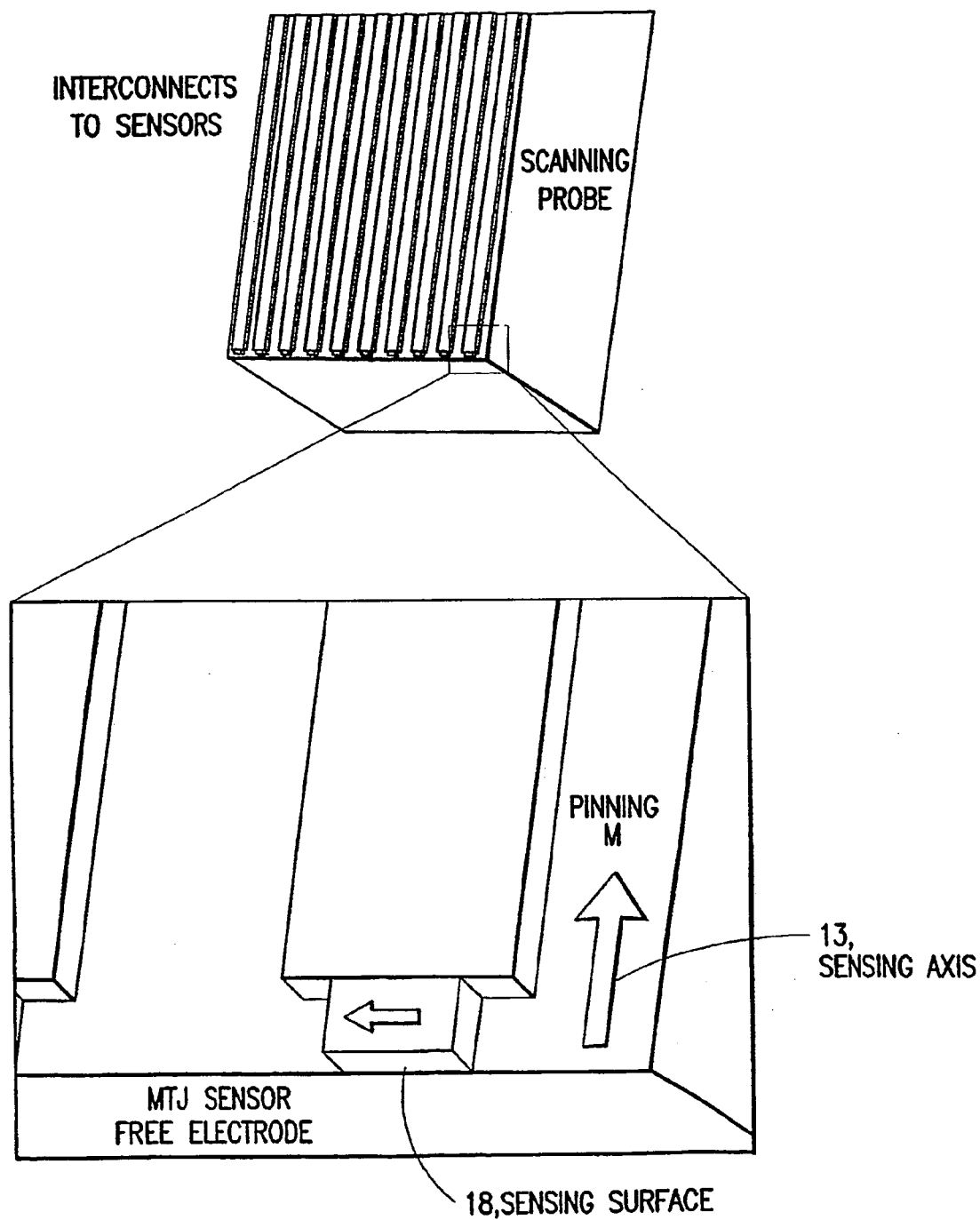
FIG. 1D shows a scanning magnetic sensor probe with a 10-sensor array used to reduce the scanning time of the magnetic microscope.

FIG. 1C shows three individual sensing units $B_z$, $B_x$ and $B_y$ oriented such that their respective sensing axes are orthogonal to one another. The combination of all three into a single magnetic sensor is depicted as a B-vector sensor 17, that includes the three sensing units arranged in such a way that all three magnetic field components can be measured. FIG. 1C also shows what is termed herein as an orthogonal sensor 19 containing two sensor units arranged in such a way that highest resolution can be achieved in two perpendicular dimensions (x and y). FIG. 1D shows a sensor containing N sensor units arranged in one dimension (1D), forming a 1D sensor array. The sensing axes 13 of each sensing unit is parallel to one another and parallel to the pinning axis as depicted. Maximum resolution may be achieved by scanning the N sensor units along a direction that is perpendicular to the sensing axis. This arrangement will reduce the measurement time by a factor of N comparing with an individual sensing unit. There are also other ways to form a sensor with multiple sensing units. For example, one can fabricate a 2D sensor array for even faster measurement throughput. The left side of FIG. 1E is a TEM micrograph of a multi-layer structure of a MTJ, with the various layers labeled. The right side of FIG. 1E is a perspective schematic of the same MTJ, similar to that of FIG. 1A.

A sensor formed using any of the above methods is mounted onto a flexible cantilever or a vertical probe in the microscope. The magnetic sensor 10 is interconnected to electrical pads. The end of the cantilever or the vertical probe is affixed to a scanning holder. A spring-loaded connector may be used to make both mechanical and electrical connections to the cantilever or the vertical probe contact points. Wire-bonding and adhesive can also be used for electrical and mechanical connections.

Using samples prepared by the processes described above, an experiment was performed to measure magnetic field sensing noise versus frequency to determine the ultimate field detection level. The sensitivity of a MR field sensor depends not only on the maximum MR ratio, but also on the inherent electronic and magnetic noise. In memory cells with hysteretic field response, a parameter of interest is the voltage noise (power spectral density $S_V(f)$) at the bi-stable "0" and "1" resistive states, where field sensitivity is close to zero. Analysis of the recorded data revealed the dominance of 1/f noise below ~500 Hz, Johnson-Nyquist "white" noise at above 500 Hz, and shot noise increasing with junction bias.

In the MTJ field sensors with linear field response, the field noise power $S_H(f)$ to be measured is dependent on the voltage noise power $S_V(f)$, as shown in the Equations of FIGS. 2B and 2C. The three terms in $S_V(f)$ are Johnson, shot, and 1/f noises, respectively. In general, a large slope of MR, 1/R, dR/dH, tends to reduce the field noise. The large saturated MR ratio, $\Delta R/R$, in the MTJ is a beneficial factor. However, it is desirable to reduce the saturation field required to rotate the free layer 16 magnetization from equilibrium ($\theta_1=0$) to saturation ($\theta_2=90°$). For this it is desirable to use a Permalloy thin film with a certain shape as the free layer to minimize the saturation field, while maintaining integrity of the magnetic domain. At high frequency (e.g. above 500 Hz), the field noise is dominated by the Johnson and shot noise. The magnitude of these two noises is the same when eV=2kT (i.e. at room temperature, V=50 mV). However, since a typical bias voltage is less than 5 mV, shot noise can be ignored. Assuming a tunneling resistance of R=500 Ohm, the ultimate field noise is about 2 pT/sqrt (Hz) (square root Hz) due to Johnson "white" noise. This compares very favorably with conventional Hall sensor (10 nT/sqrt(Hz)) and the fluxgate (10 pT/sqrt(Hz)), which is a bulky sensor.

More difficult to deal with is the 1/f noise, which originates from many sources, such as disorders (potential and magnetic trappings) and thermal fluctuation of magnetization in the electrodes. One avenue to approach is problem is via an understanding of how thermal annealing affects the 1/f noise. Research by the present inventor has shown moderate thermal annealing increases the MR ratio of MTJs. This enhancement is possibly due to the reduction of disorders near the interface, which may also reduce the 1/f noise. High purity sputtering targets may also be used to reduce impurity levels. It is also possible to fabricate a dual-layer structure for the free layer 16, e.g., on the tunnel barrier 14 first deposit a thin Co film (1 nm) and then a thicker permalloy film (10 nm). The Co ferromagnet ($T_c$=1446 K) has a much larger spin-wave stiffness constant than Permalloy ($T_c$=850 K). Therefore, the thermal fluctuation of magnetization is much weaker in Co than in Permalloy. Since tunneling occurs near the interface, the associated 1/f noise due to thermal fluctuation is reduced. Co also has a larger spin polarization, a positive for the MR ratio. Furthermore, since the free layer 16 magnetization is dominated by the Permalloy component, the free layer 16 still retains its magnetic softness in terms of anisotropy. The sensitivity of the sensor 10 is not affected adversely by the ultra-thin Co layer.

Our research has shown moderate thermal annealing increases the MR ratio of MTJs. This enhancement is possibly due to the reduction of disorders near the interface, which may also reduce the 1/f noise. High purity sputtering targets may also be used to reduce impurity levels. It is also possible to fabricate a dual-layer structure for the free layer 16, e.g., on the tunnel barrier 14 first deposit a thin Co film (1 nm) and then a thicker permalloy film (10 nm). The MTJ sensors 10 described herein may be grown via sputtering on a Si wafer and patterned using optical and/or electron-beam lithography.

EHE sensors may also be employed within the present invention. One embodiment of an EHE magnetic sensor according to the present invention comprises an alloy of the form $R_y[M_xN_{100-x}]_{100-y}$; wherein $0 \leq x \leq 100$, $0.00 < y \leq 20.00$, and M is selected from the group consisting of Fe, Co, Ni, $Fe_zCo_{100-z}$ wherein $0<z<100$, and other magnetic alloys containing Fe, Co or Ni.

The present invention also contemplates an array of N EHE magnetic sensors, N being an integer greater than one. The alloy is formed into a Hall bar along which sense current is carried between two opposing points located on the Hall bar, as shown, for example, at FIG. 18 of U.S. patent application Ser. No. 10/371,321, incorporated by reference above. The array further comprises a plurality of voltage wires for measuring Hall voltage between the two points that are located along the particular voltage wire, and a plurality of field sensors defined by an intersection of a voltage wire with a Hall bar.

In another embodiment of the present invention, an EHE magnetic sensor comprises an alloy defining a thickness t of the form $R_y[M_xN_{100-x}]_{100-y}$, wherein $0 \leq x < 100$, $0.00 \leq y \leq 20.00$. M is selected from the group consisting of Fe, Co, Ni, $Fe_zCo_{100-z}$, and all magnetic transition elements, wherein $0<z<100$. Furthermore, N is selected from the group consisting of Pt, Y, Zr, Nb, Mo, Tc, Ru, Rh, Pd, Hf, Ta, W, Re, Os, Ir, Au, In, Sn, Te, Tl, Pb and Bi. The alloy according to this embodiment exhibits a temperature coefficient T.C. having an absolute value |T.C.|≈0.003 $K^{-1}$, at least in the temperature range 273 K to 350 K.

Further details concerning EHE sensors may be found in U.S. patent application Ser. No. 10/371,321, incorporated by reference above.

Figure 3A:
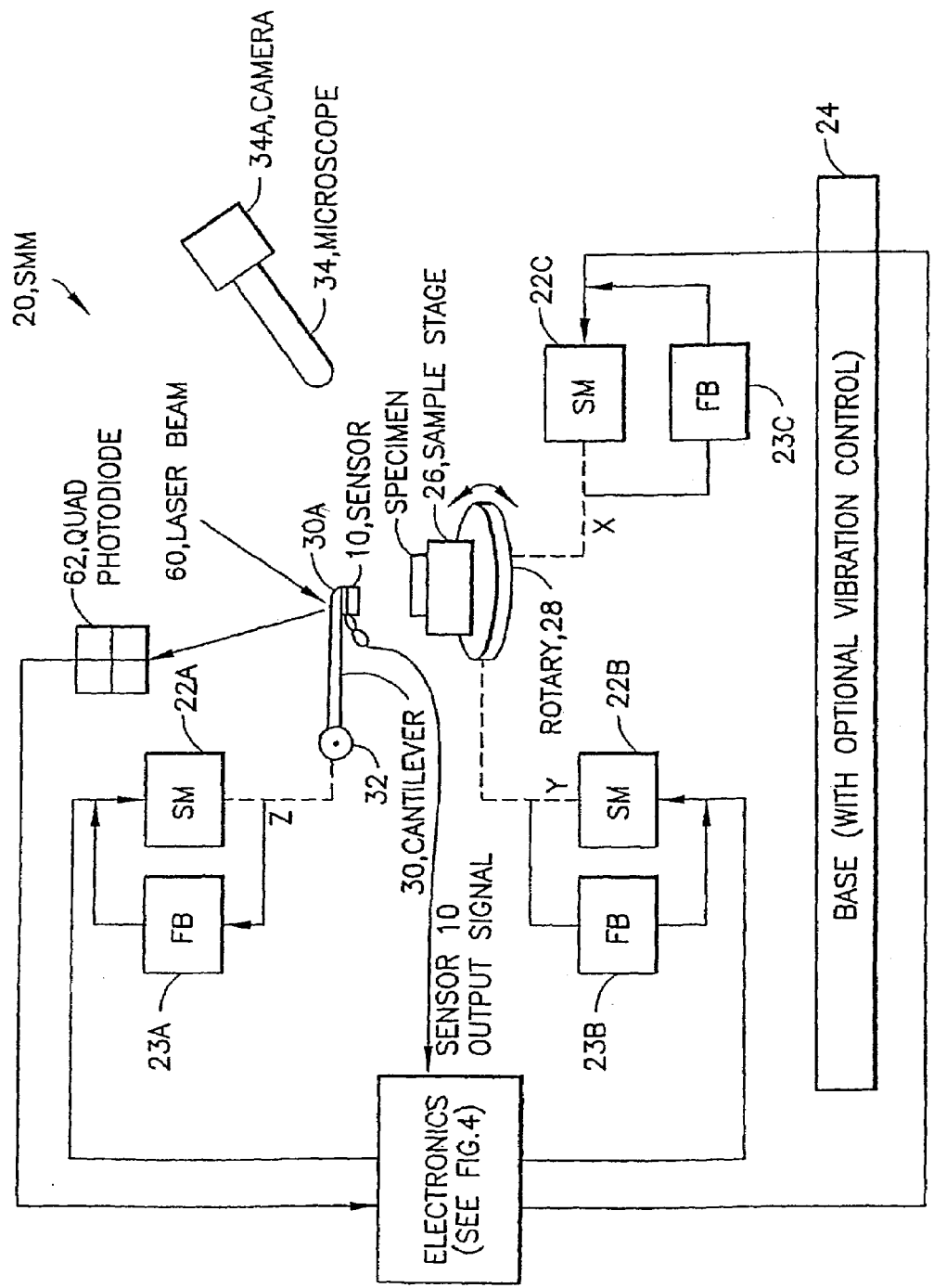

FIG. 3A shows a simplified block diagram of a Scanning Magnetic Microscope (SMM) 20 constructed in accordance with these teachings. The SMM 20 includes three automated axis drives using DC servo motors 22A, 22B, 22C with optical feedback loops 23A, 23B, 23C that provide 0.1 μm minimum incremental motion and positioning error of <1 μm/cm of travel. The stages are heavily built with a massive base 24 to reduce vibration. Specimens are mounted on an aluminum sample block 26 that is affixed to a manual rotary stage 28. This in turn is mounted on the x-axis and y-axis stages. The specimen is held on the sample block 26 by vacuum channels or adhesives or an electrical socket. The sensor 10, which may contain a single sensing unit or multiple sensing units as shown in FIG. 1B–D, is mounted to an vertical probe or a cantilever arm 30, which overhangs the active area (e.g., 4×4 inch$^2$) of the specimen stage. The vertical probe or the cantilever is attached to a miniature, 1-cm travel, micrometer stage 32 that is mounted to the third servo driven z-stage. In operation, this 'z-axis' motion permits the sensor 10 to be positioned above the specimen surface at a fixed distance during automated scanning. A wide-angle zoom optical microscope 34 (e.g., 8× to 45×) or an infrared camera may be used to inspect the position of the sensor 10 relative to the specimen surface, or the thermal profile of the specimen surface.

The optical microscope 34 can be equipped with a CCD camera 34A for visual inspection of the specimen. In this case it may be desirable to superimpose the magnetic image on the optical image of the specimen, such as an integrated circuit (IC) device or a magnetic medium. The comparison of the two images enables the user to pinpoint the location(s) of abnormality and defects. A "joystick" capability may be included to control the scanning position and area. Various specimen holders can be designed to accommodate different specimen. Magnetic media and flat objects can be fixed using vacuum channels on sample stages. For IC's, universal or special sockets (zero-force insertion type, for example) can be used for convenient mounting and electrical connection during imaging.

Figure 3B:
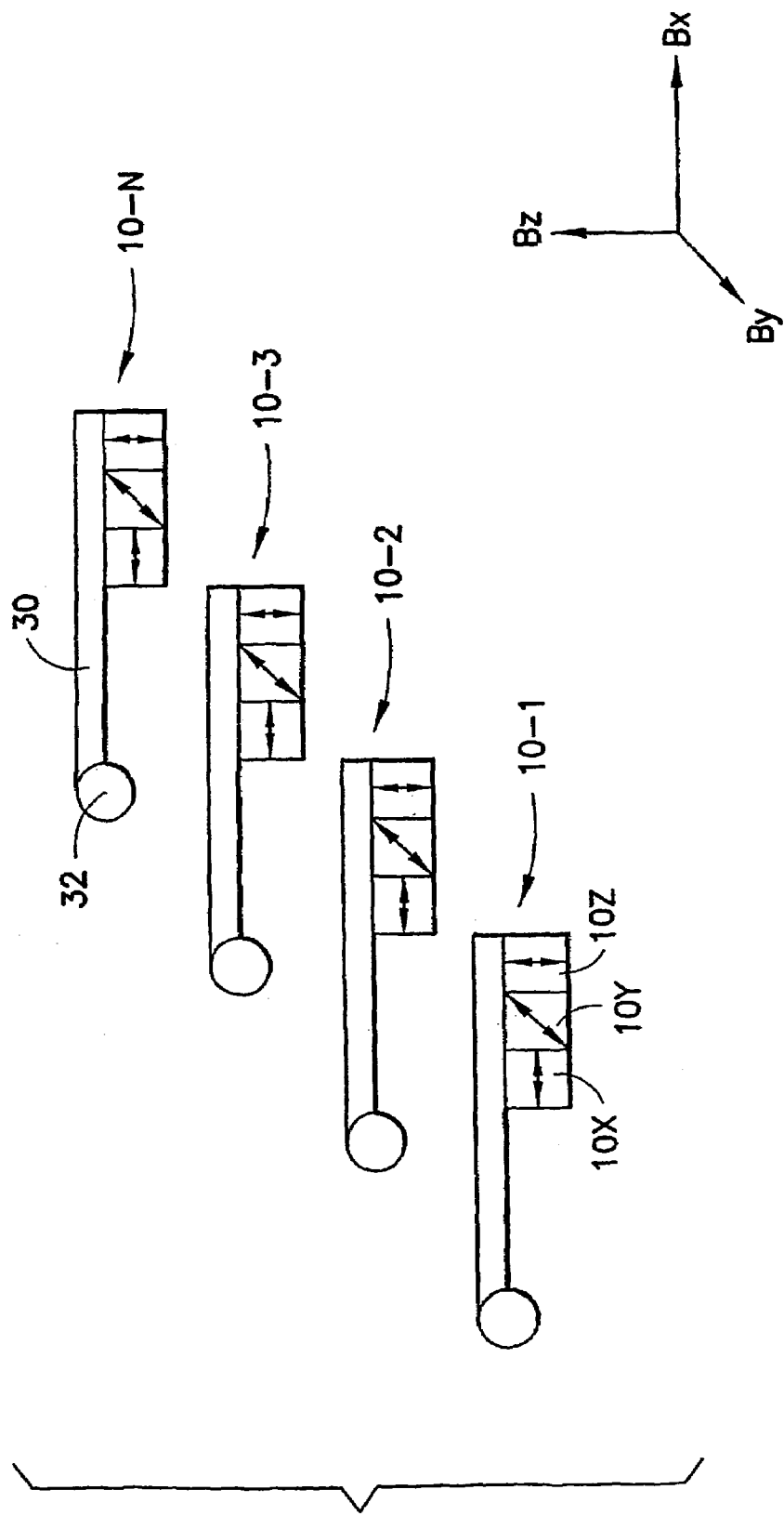
FIGS. 3B and 3C show in partially pictorial, partially schematic form, different embodiments of a sensor mounted on a cantilever from FIG. 3A.
Figure 3C:
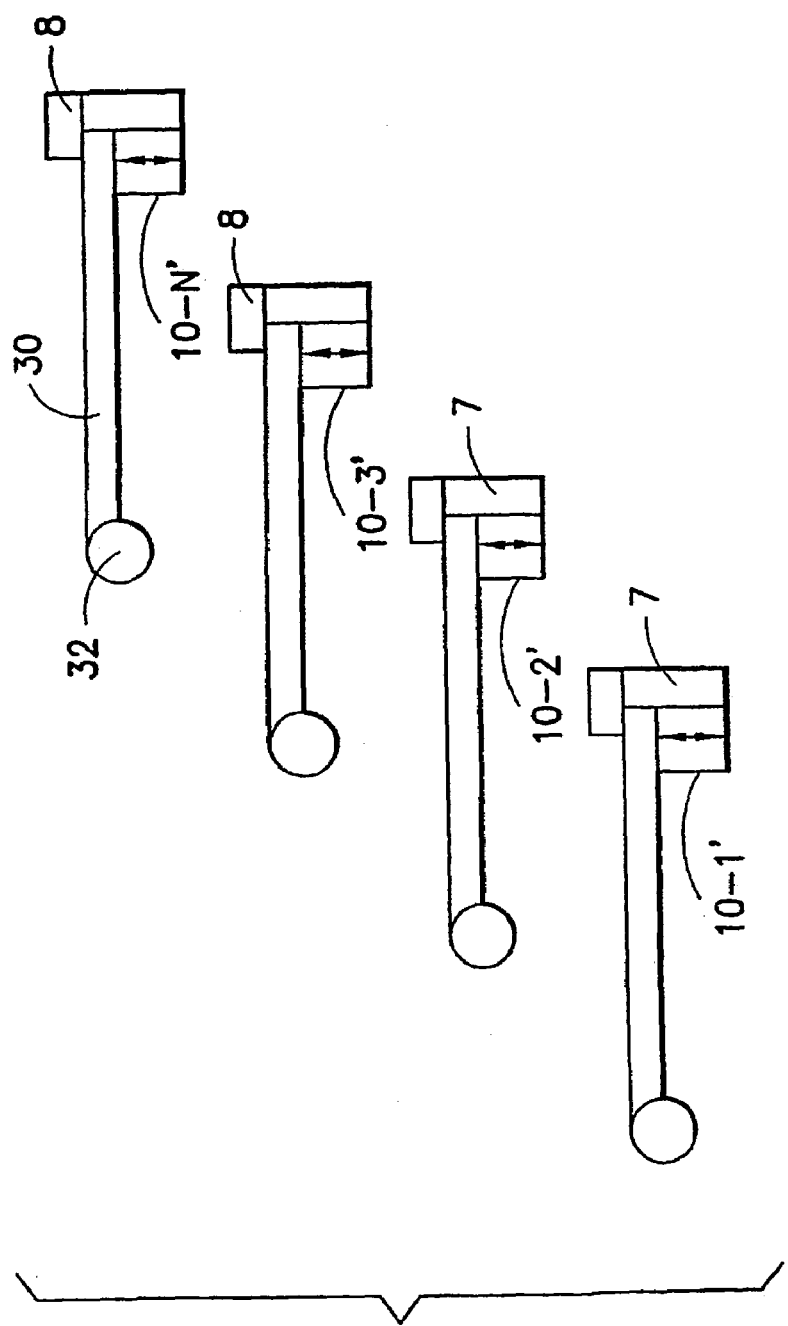
Figure 3D:
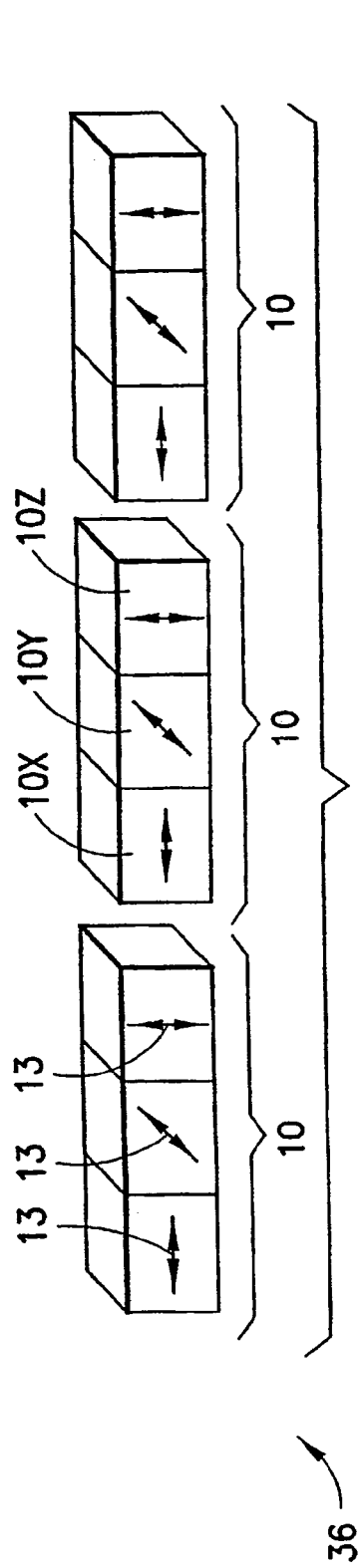
FIGS. 3D–3F show in isolation, one, two, and three-dimensional arrays of sensors, respectively.
Figure 3E:
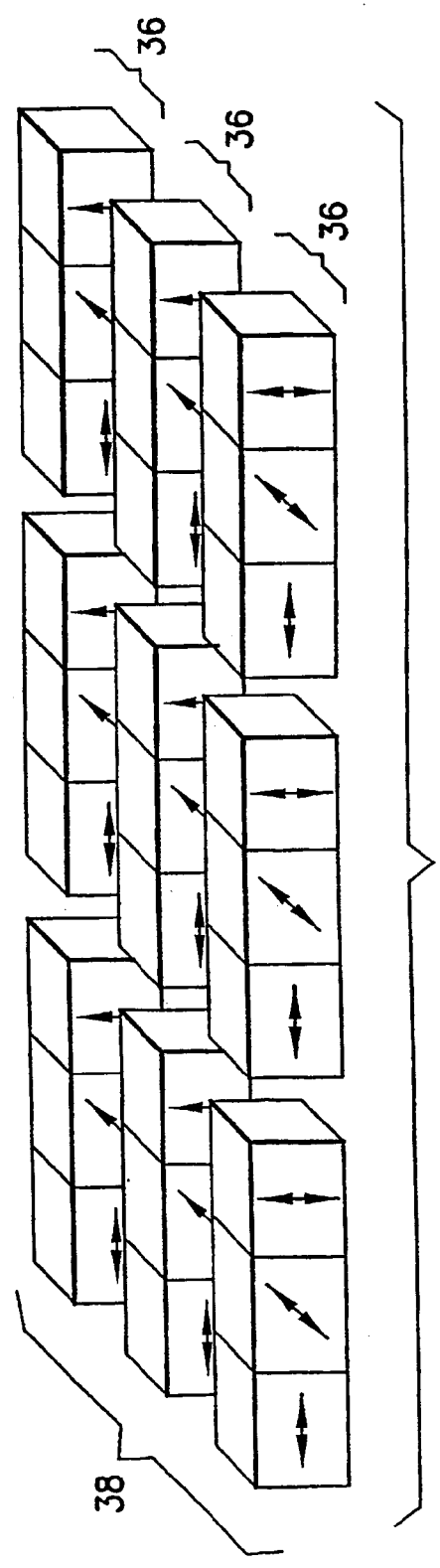
Figure 3F:
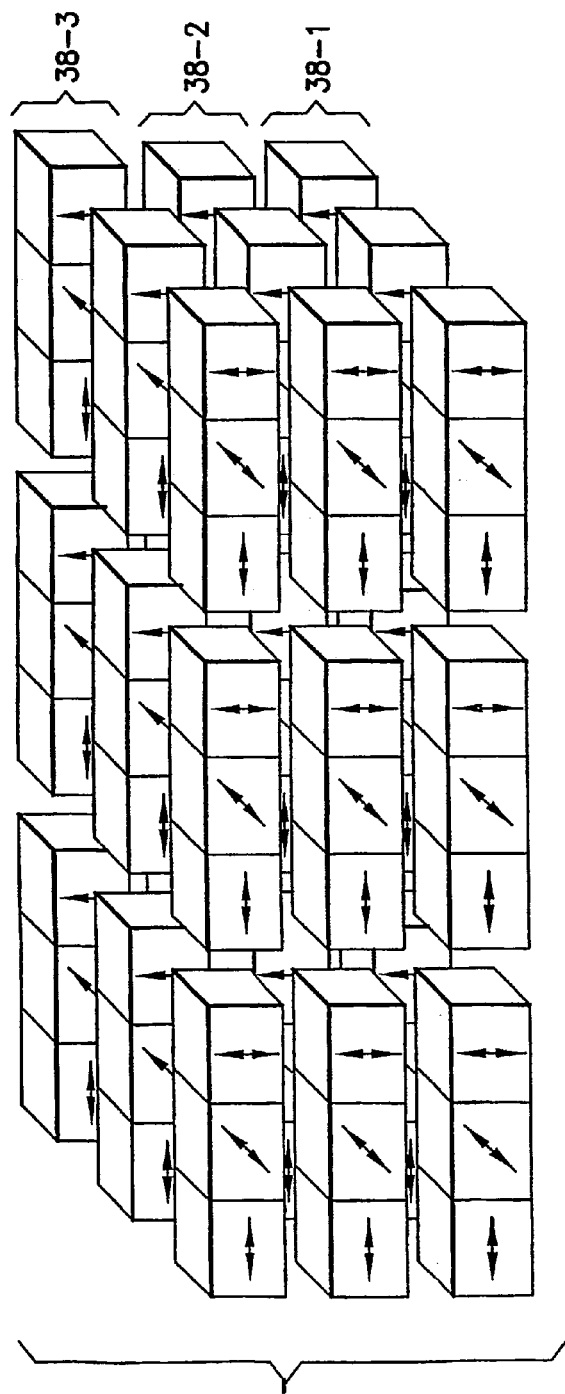
Figure 3G:
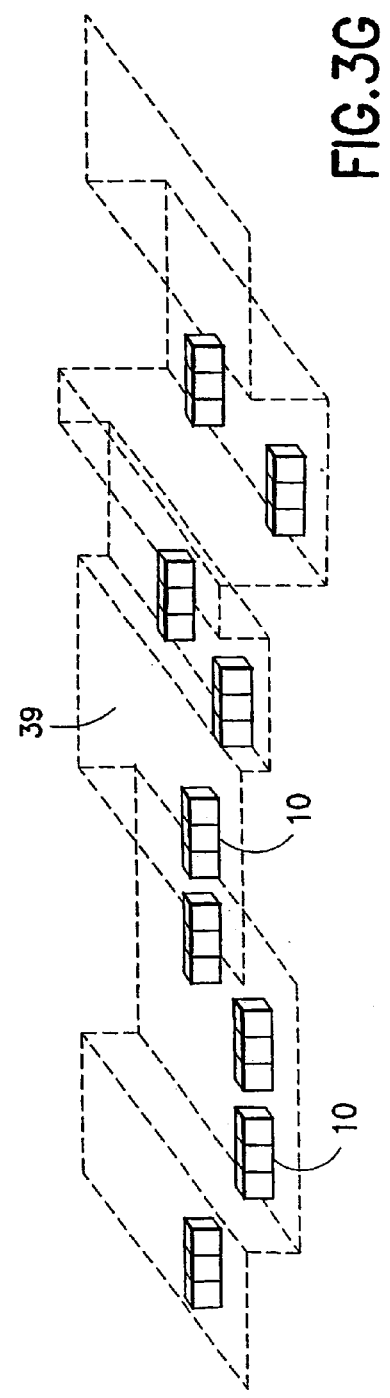
FIG. 3G shows a one-dimensional array of sensors, each stepped across a variable surface of an integrated circuit specimen.

To inspect IC chips with a state-of-the-art feature size, the SMM 20 employs a high precision mechanical scanner for motion control. In the embodiment of FIG. 3A, high-resolution and long travel XY stages are used, with a 25 nm resolution and a ±10 nm repeatability. In addition to XY motions, rotational motions, provided by rotational stage 28, may be desired about the same XY axes. The vertical probe or cantilever 30, which holds the MTJ sensor 10, is attached to the Z-axis stage. The sensor-specimen distance can be predetermined to be any reasonable value. The vertical position of the sensor 10 may be monitored by using an optical technique, such as a laser beam reflection technique, wherein a diode laser beam 60 (FIG. 3A) is focused on a reflective (e.g., gold-coated) back surface 30A of the cantilever 30. The reflected beam position is then measured by a quadrant photodiode 62 having an output connected to the PC 50. When in contact with the specimen, the cantilever 30 bends slightly and induces a variation of the reflected beam position. The output of the photodiode signal is used for height (z-axis) control. The Z-axis stage is programmed to control the height automatically while the specimen is being scanned. The contact mode may be used for maximum spatial resolution, while the fixed-height mode is suitable for fast scanning. Preferably, stage 32 is used in an active height separation system in which laser beam 60 monitors the height of the sample surface as well as the sensor and stage 32 is driven by its servo to maintain the sensor 10 at a fixed height above the surface. Other height control mechanisms such as capacitance gauge can also be used.

Where the surface of a sample or specimen is non-planar (e.g., surface features of an integrated circuit chip), a plurality of sensors 10-1, 10-2, ... 10-N may be employed such that each sensor 10-1, 10-2, ... 10-N moves in the z-direction (e.g., relative to a surface of a specimen) independently of one another (see FIGS. 3B–3C and 3G). Illustratively, laser beam 60 is split to form a surface-sensing beam that is monitored by a second photodetector 62', not shown, as well as the beam sensing the position of the sensor, but many other systems will be apparent to those skilled in the art. Use of active height clearance control to maintain an offset distance provides an improved image of the current distribution within the integrated circuit, as height variations will not be confused with defects in the wiring, etc.

In one embodiment, the sensor 10-1, as shown in FIG. 3B, comprises three sensing units 10X. 10Y and 10Z, oriented to detect magnetic field components $B_X$, $B_Y$, and $B_Z$, respectively. The sensor 10-1 is preferably mounted on a cantilever arm 30 and a micrometer stage 32 as described with reference to FIG. 3A. The sensing units 10X, 10Y, 10Z of a single sensor 10-1 are preferentially placed in close proximity (a few to hundreds of microns) to one another so that they measure the three orthogonal components of the field B at essentially the same location. In an embodiment adapted to scanning a large surface area of a specimen and collecting data rapidly, a scanning magnetic microscope system may incorporate a 1D sensor array as shown in FIG. 1D. Another embodiment involving multiple sensors 10-1', 10-2', . . . 10-N' is shown in FIG. 3B, wherein the sensors are disposed along a transverse axis (parallel to $B_y$ as depicted in FIG. 3B). Each sensor defines a single sensing unit having a sensing axis 13 (parallel to the axis $B_z$ of FIG. 3B) that is perpendicular to a measurement axis (parallel to the axis $B_x$ of FIG. 3B) along which measurements are taken as one or both of the sample and/or the sensors 10 are translated. Such single-unit sensors may be arranged in a one-dimensional array of sensors 10-1', 10-2', 10-3', . . . 10-N', similar to that of FIGS. 3B and 3C. The total number of sensors (n) may include as many sensors 10 as will fit over the sample. Each cantilever arm 30 or other sensor mount may be connected to separate positioning systems and to separate electronic channels for recording readings. In other embodiments a plurality of the sensors 10 may all be connected to and translated by the same arm (such as the cantilever 30 shown in FIG. 3A). Of course, placing more than one sensor 10 on the arm may complicate the control of the sensor 10 in the z-axis for following sample surface features, especially if some of the surface features have a size that is close to the size of the sensors. As such, individual z-axis positioning control for each sensor 10 may be preferred for some embodiments.

In the contact mode, the bottom surface of the sensor or sensors 10 preferably has a hard coating such as an amorphous carbon film, a synthetic diamond film, or other hard film. In addition, an insulating non-magnetic lubricant may be applied to the surface of the sample and/or the sensors. FIG. 3C shows schematically an example in which tubes 7 attached to the sensors 10-1', 10-2', . . . 10-N' feed a conventional lubricant to the surfaces of the sensors. The lubricant is fed through tubes 7 from a bulk reservoir 8. While the bulk reservoir 8 is depicted as affixed to the cantilever arm 30, it is preferable that the bulk reservoir 8 be remotely supported to eliminate changes to the mass supported by the cantilever arm 30 during examination of a specimen. Preferably, a discharge end of the tube 7 is affixed to the cantilever arm and a bulk reservoir 8 is supported on a non-sensing component. It is stipulated that in such an arrangement, both the tube 7 and the bulk reservoir each are reservoirs of lubricant. The contact mode may also feature a spacer on the bottom surface or formed in the bottom surface of sensors 10, so that the magnetic field is measured at the same distance from the surface of the circuit or other object being tested.

Sensors according to the present invention may be employed in one, two, or three dimensional arrays, as well as individually. Each sensor component of such arrays may include only one magnetic sensing unit, such as depicted in FIG. 3C, or more than one sensing unit as depicted in FIG. 3B. A one dimensional array 36 of sensors 10 is depicted in FIG. 3D, wherein each sensor 10 includes three sensing units 10X, 10Y, and 10Z. A two dimensional array 38 is depicted in FIG. 3E as being constructed from a plurality of one dimensional arrays 36 as described above.

A three dimensional array of magnetic sensors 10 is shown in FIG. 3F, wherein a plurality of two dimensional arrays 36-1, 36-2, 36-3 are disposed adjacent to one another perpendicular to the plane that they define. A three dimensional array is particularly important for high speed measurement. For example, assume each of the two dimensional arrays 38-1, 38-2, 38-3 are disposed as depicted in FIG. 3F such that the sensing surfaces lie along the x-y plane and each two dimensional array 38-1, 38-2, 38-3 is layered in the z direction. For scanning along the x-y plane, the sensors of each two dimensional array gather data at slightly different time instants, allowing faster scans of specimens and enabling parallel processing of data. For example, sensors in a first layer 38-1 may sense and gather magnetic field data at a first time instant, sensors in the second layer 38-2 may sense and gather such data at the same or at a second instant, etc. for all layers. All magnetic fields in space can be mapped, and data from each layer can be processed, recombined, or manipulated according to designed formula in order to deduce maximum information of current density distribution in complex IC chips. For example, the signals from two equivalent sensors in two consecutive layers can be subtracted from one another. The resulting data is the local magnetic field gradient produced by the IC under test. The field gradient is a useful parameter for quantitative analysis.

For applications wherein very high sensitivity is desired for a specimen that defines a non-planar surface, such as most integrated circuits, a plurality of sensors 10 may be employed as a one dimensional array 36 as depicted in FIG. 3G, each sensor independently moveable in the z direction (e.g., the direction that is substantially perpendicular to the surface along which measurements are taken). Individual sensors 10 are small enough to be disposed among the trace lines and trenches along the surface of an IC 39, the surface of which is shown in FIG. 3G as phantom lines. In this illustration, the translation direction is the direction $B_y$ of FIG. 3B, and the individual sensors 10 move in the $B_z$ direction independently of one another, or 'step' across the surface of the IC 39. Preferably, stepping the sensors 10 occurs in the contact mode, but with active height control for each sensor 10, the sensors may step while in the non-contact mode and spaced from the surface of the specimen.

Figure 4:
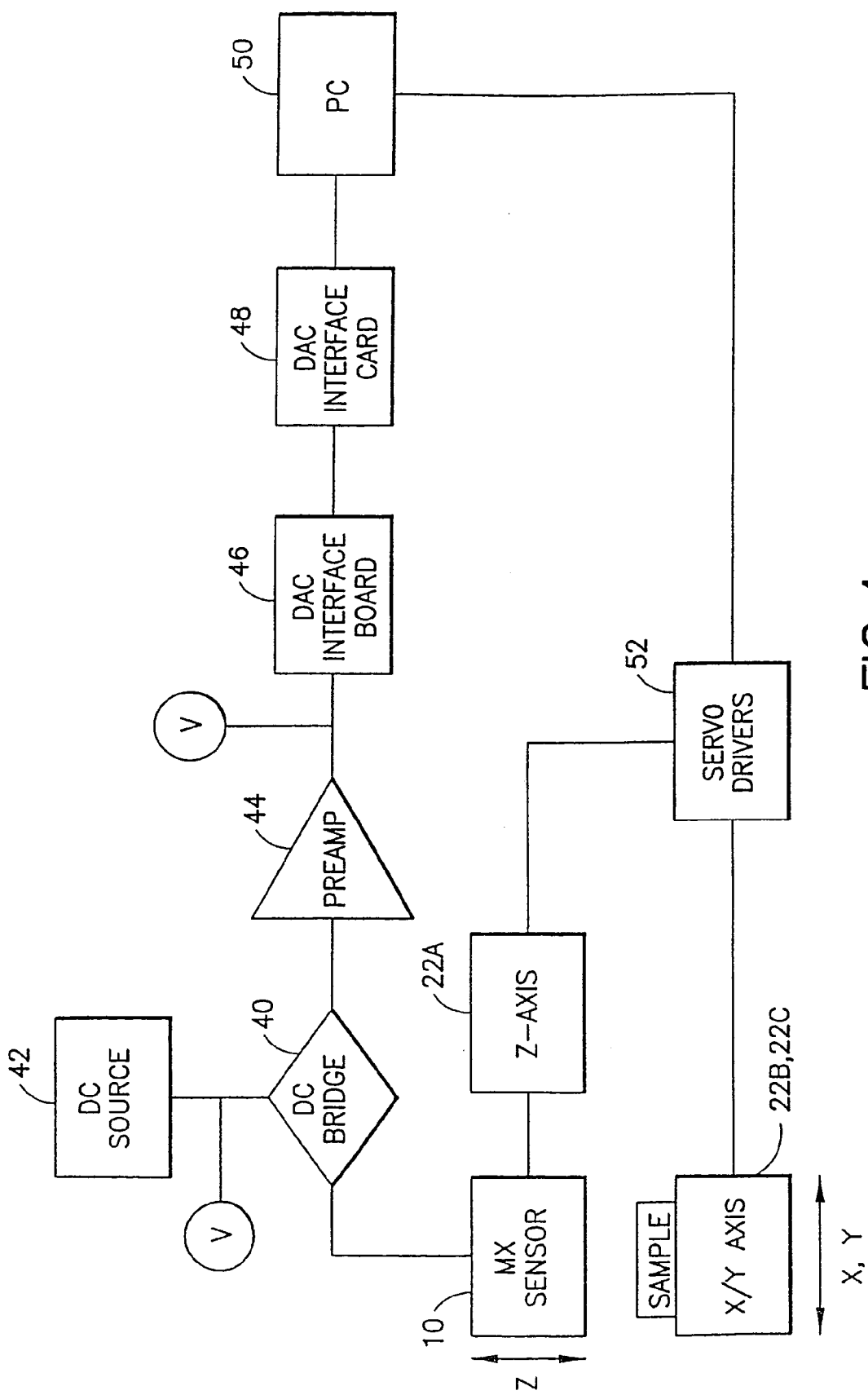

FIG. 4 shows a block diagram of the electronics of the SMM 20. Such a diagram represents only one embedment of the microscope. For different applications, other more appropriate electronics diagrams may also be used. The output of the sensor 10 is connected to a Wheatstone bridge circuit 40 having an associated DC source 42. The bridge 40 preferably has built-in protection for the sensor 10 against current surge and electrostatic breakdown that is active both during installation and during operation. Two low-forward voltage (0.5V) diodes D1 and D2 can be connected with opposite polarity in parallel between each sensor and ground. For applications where the signal magnitude is low, a grounded conductive shield 21 is preferably mounted about the sample and sensors. The output of the bridge 40 is fed into a low-noise differential preamplifier 44 and then into a DAC connector block 46 (e.g., National Instruments BNC-2090). The amplified signal is collected at 100 kHz using a 16-bit data acquisition board 48 (e.g., National Instruments PCI-MIO-16XE-10). The system is computer controlled using, by example, a PC 50 running a National Instruments LabVIEWJ platform. The PC 50 controls the servo drivers 52 that provide motion in the X,Y and X axes for translating the sensor 10 relative to the surface of the specimen.

Alternatively, the sample may be moved relative to sensors that are fixed, or both may be moved at the same time, as is suitable for a particular application: i.e., the three foregoing embodiments can be described by the phrase 'at least one of the sensor and the specimen is moved'.

The system can be configured for point-to-point scanning or to scan on-the-fly. Using the illustrated electronics a sensitivity of 60 mV/G can be achieved. The system is capable of scanning point-to-point at 10–30 Hz, depending on the size of the scanned area, while acquiring, for example, one thousand measurements at each point to reduce noise. The software system provides a two-dimensional field map of the scanned area as the system acquires data in real time.

Figure 5:
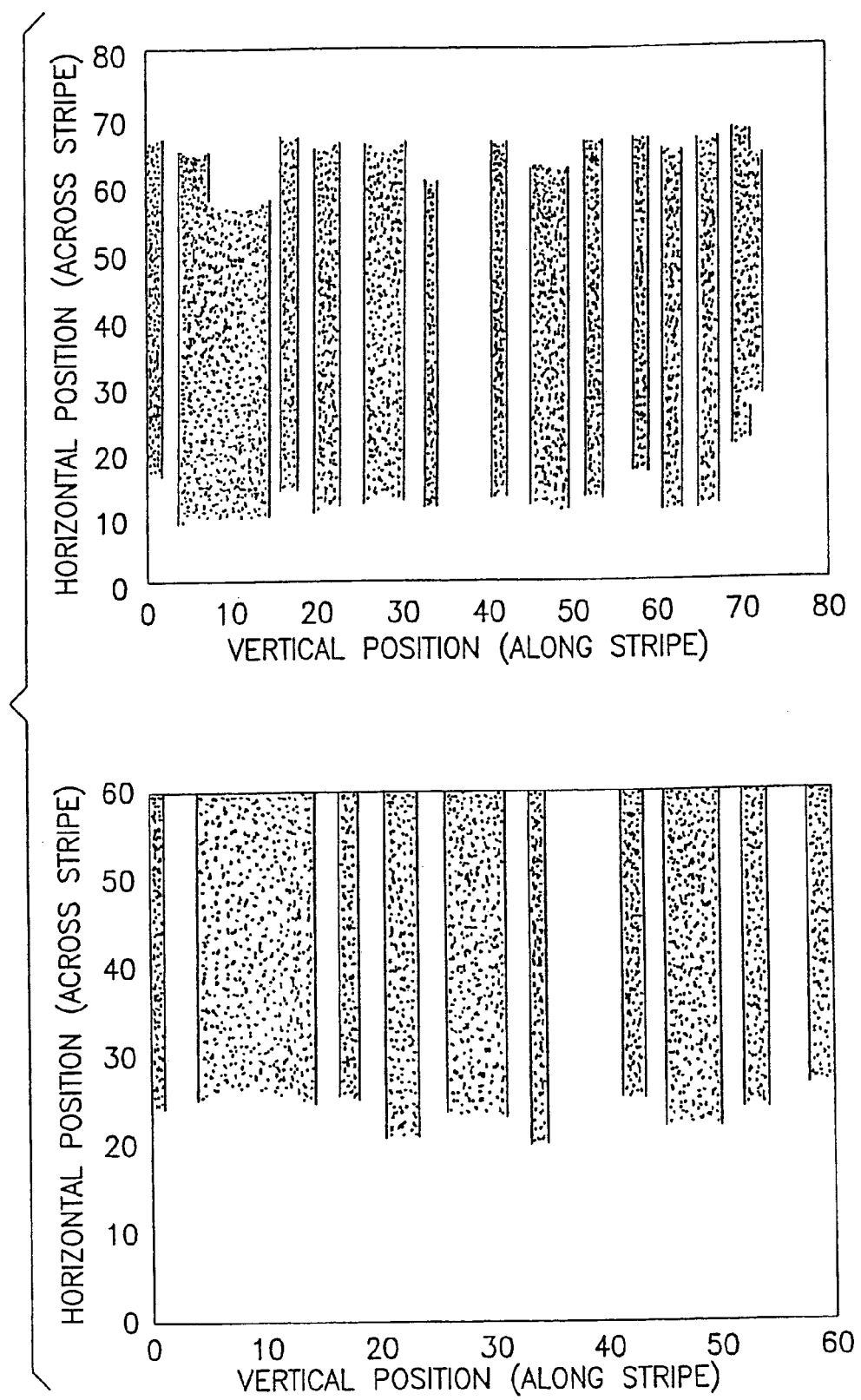
Figure 7A:
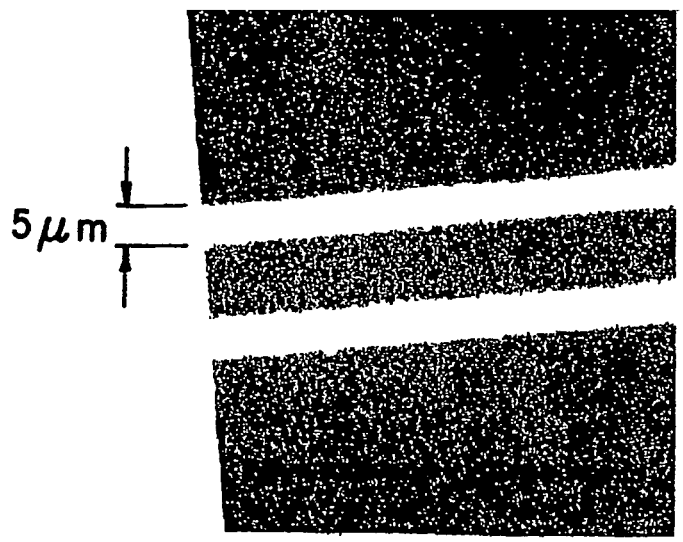
FIG. 7A is optical microscope image of features from an integrated circuit.
Figure 8A:
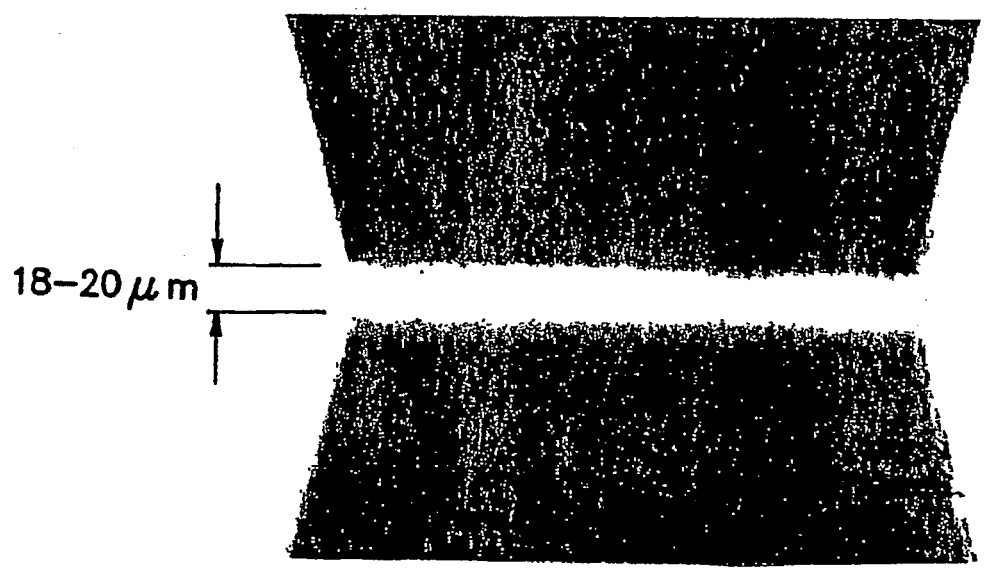
FIG. 8A is an optical microscope image of features from an integrated circuit.
Figure 7B:
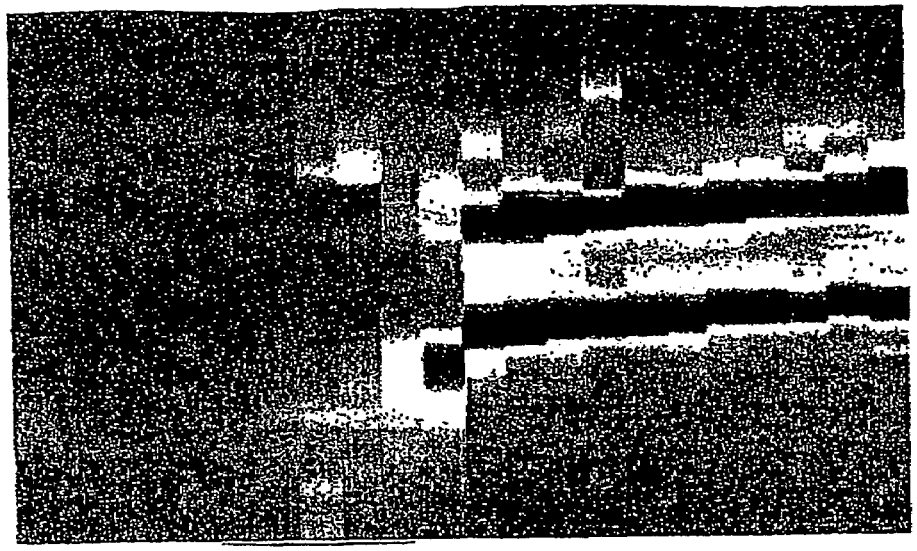
FIG. 7B is the corresponding current density map obtained using the SMM.
Figure 7C:
FIG. 7C is the corresponding magnetic field image.
Figure 8B:
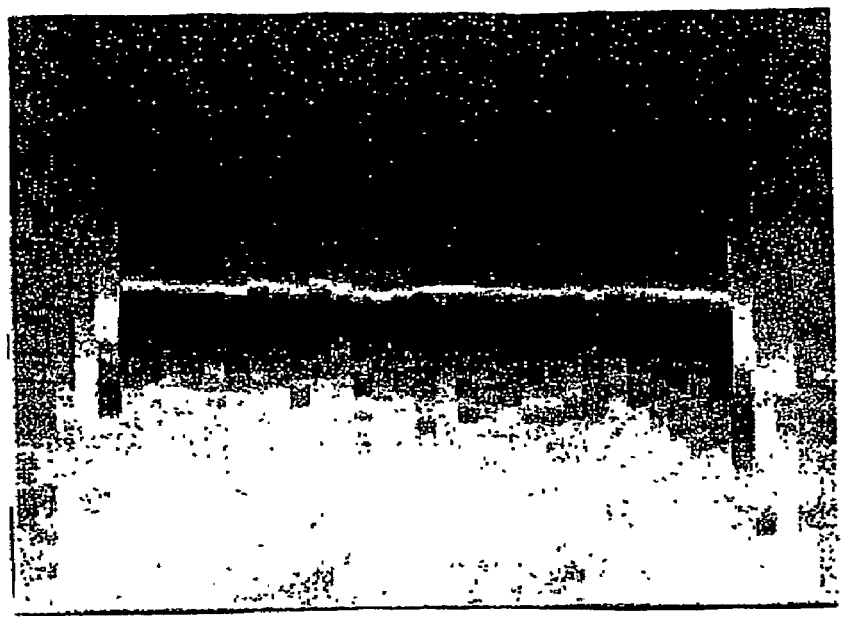
FIG. 8B is the corresponding magnetic field image.
Figure 8C:
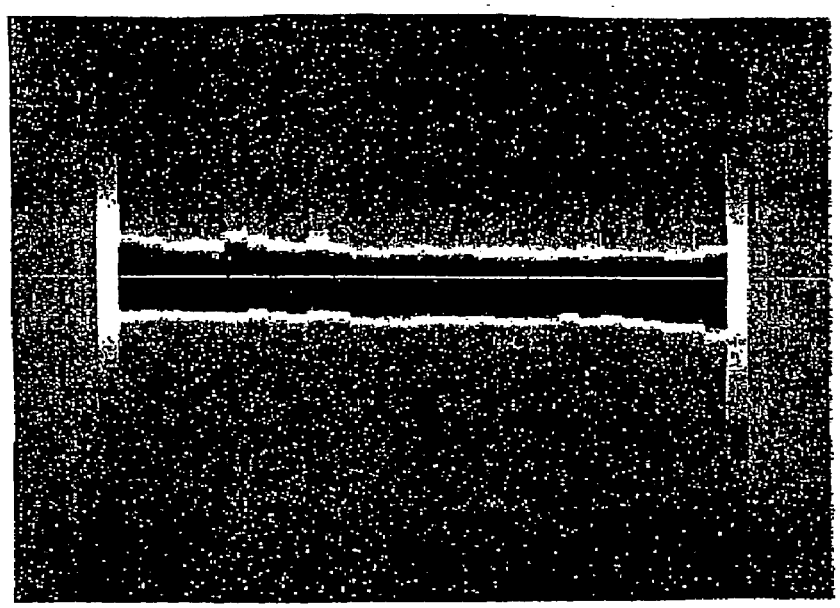

FIG. 5 is an example of magnetic images obtained from the magnetic stripe of an identification card, while FIGS. 7 and 8 are examples of images obtained from an integrated circuit. More particularly, FIG. 7A is an optical microscope 34 image of features from an integrated circuit; FIG. 7B is the corresponding current density map obtained using the SMM 20; and FIG. 7C is the corresponding magnetic field image; whereas FIG. 8A is the optical microscope 34 image of features from an integrated circuit; FIG. 8B is the corresponding magnetic field image; and FIG. 8C is the corresponding current density map.

The electronics for the sensor 10 are designed to operate over a wide bandwidth, from DC to at least a multiple megahertz range, and possibly into the GHz range.

High-resolution microscopy demands high accuracy and precision. Therefore, vibration isolation of the SMM 20 is preferred, particularly in a noisy environment. A commercial vibration isolation system can be used for this purpose. A cost effective strategy is to construct a tubular frame and to use a commercial component such as BenchTop™ pneumatic vibration isolation platform, by Newport Corp. of Irvine, Calif. This construction technology attenuates the mechanical motion with a set of damped pneumatic isolators. The hybrid-chamber design generates a high damping force for faster and more efficient damping of vibrations. The BenchTop™ unit is a compact vibration isolation system (16×20 $in^2$ and 30×36 $in^2$, height 2 inches) and, as such, is well suited for the SMM 20. An acoustic and/or electromagnetic shielding enclosure can be used with the SMM 20 for making very sensitive measurements.

While described above in the context of the Wheatstone bridge circuit 40 for measuring the sensor 10 MR response, electronic bridge auto-nulling and op-amp replacements for the bridge resistances may also be used. In this manner different resistances of the various special purpose MTJ sensors can be accommodated electronically. One challenge of using an MTJ sensor is that the device is electronically fragile and can be easily damaged by a current surge and/or by an electrostatic discharge. Thus, protection circuitry is desirable.

To define a scanning area, the operator selects an area of interest on the visual optical image on a monitor screen using a pointing device (e.g., a mouse) cursor. The computer 50 then controls the Z-axis position of the sensor 10 as the scan proceeds within the area. The laser beam reflection system 60, 62 measures each local height of the specimen. Based on this information, the software establishes the local height profile, and controls the sensor at either a fixed height or in contact with the specimen while scanning.

One of the applications of the SMM 20 is in the semiconductor industry for non-invasive testing of IC chips, printed circuit boards, and hybrid microcircuits. In this context the SMM 20 images the magnetic fields near the surface of a specimen. The application software executed by the PC 50 (or by another processor) generates a two-dimensional image of the current distribution, as calculated from the magnetic field image. The mathematics of this conversion is known in the art as the "magnetic inverse problem". In general, the magnetic inverse problem does not have a unique solution of current distribution. However, it has been demonstrated that for current distributions restricted to two dimensions, the inverse problem can be solved uniquely. The mathematical techniques involved are Fourier transforms combined with spatial filtering. In an IC chip, the electronic network can be approximated as a two dimensional current network, assuming that the thickness of the network is much smaller than the distance between the current source and the sensor 10.

Figure 6:
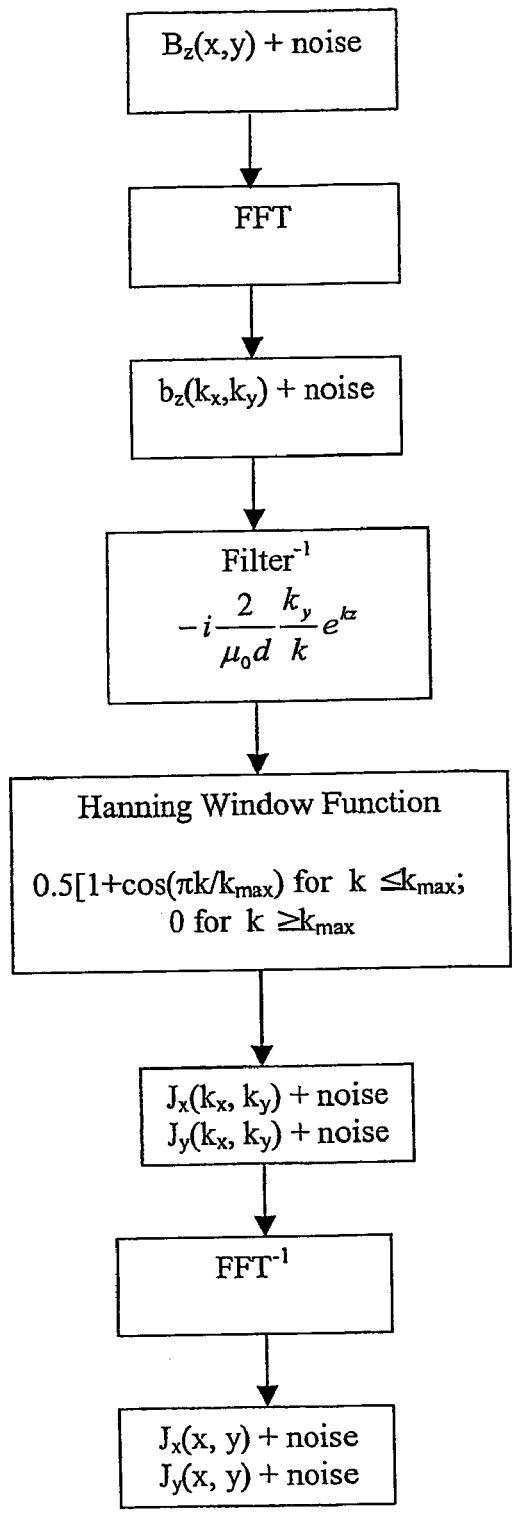

One suitable algorithm was developed by Roth et al., which uses fast Fourier transformation (FFT) and Green's function method. In this algorithm, the current density distribution $J_x(x,y)$ and $J_y(x,y)$ can be obtained by measuring any one component of the magnetic field (e.g. $B_z(x,y)$). FIG. 6 outlines the computer calculation model. In the instant embodiment the SMM 20 first scans the surface of an IC chip, and obtains the z-component magnetic field image $B_z(x,y)$ that contains some noise. The software performs a fast Fourier transform and uses the continuity equation in the theory of electricity and magnetism to obtain $b_z(k_x,k_y)$, which is then divided by a filter function, namely, the Fourier transform of the Green's function in the equation of Biot and Savart in electromagnetism. In the presence of noise, the inverse calculation may be unstable because the high-spatial-frequency noise is inevitable amplified. A common technique to surmount this difficulty is to apply a Hanning window function, which eliminates the high-spatial-frequency components. After obtaining the Fourier components $j_x(k_x,k_y)$ and $j_y(k_x,k_y)$, inverse fast Fourier transforms are employed to yield the real-space images of the current distributions $J_x(x,y)$ and $J_y(x,y)$.

The current distribution image is dependent on the noise level in $B_z(x,y)$, the sensor-specimen distance, the size of the MTJ free electrode 16, and the spatial feature size of the current network. Certain factors can be automatically measured by the SMM 20 electronics (noise, distance, etc.) for inclusion in the calculation.

For magnetic storage media applications, the SMM 20 may be employed to assist engineers to evaluate magnetic uniformity of a medium, and/or the sizes and positions of magnetic particles (contaminants) on a medium surface. One of the principal limits affecting the manufacturing yield of magnetic storage media is the presence of unwanted magnetic particles, which are more detrimental to the performance of the media than the occasional non-magnetic particles. The SMM 20 may be employed for such production line quality control evaluations. Unlike the magnetic force microscope, that is sensitive only to the field gradient, MTJ SMM 20 may be used to measure the absolute field strength from the magnetic particles. The high sensitivity of the MTJ sensor 10 allows rapid scanning and thus facilitates production line inspection. For example, the SMM 20 may be used to track and map the amplitude and the direction of the dipolar moments, the size distribution and the field strength of magnetic particles on the media, as well as to locate non-magnetic inclusions. This type of information is a significant aid in production quality control.

There are in general two types of applications for the MTJ device in accordance with these teachings, one for magnetic memory, called non-volatile magnetic random access memory (MRAM), and the other for the magnetic sensor 10, as used in the SMM 20. For MRAM applications, one needs to compensate the interlayer magnetic coupling, as discussed above. For the magnetic sensor 10 application, it is advantageous to compensate for the interlayer magnetic coupling, but it is less critical. The surface roughness of the electrode Py (6 nm) immediately below the insulating layer $Al_2O_3$ (0.5–2.5 nm) causes a Néel coupling field. To compensate for this field, one may adjust the thickness of Py layer, and the entire polar field can therefore cancel the Néel field. Another method is to use a tri-layer structure as described above.

Other applications may also benefit from the use of these teachings, including investigations of type II superconductors, micromagnetics in small magnetic systems, and biomagnetism in biological materials. The ability to make non-contact magnetic field measurements can be especially beneficial in some of these applications.

One particularly advantageous application is described in FIG. 9, which illustrates in plan view two scanning magnetic microscopes 20A, 20B according to the present invention. Each SMM 20A, 20B comprises a magnetic sensor 10 mounted to a collar 70 movable along a stationary rod 72 that spans a length or alternatively a width of a table 74 that supports a biological host 76, such as a patient. The sensor 10 is electrically coupled to remote electronics 73, such as any combination of the DC source 42, PC 50, etc. described above, via a cable 75. Cable retention means such as a spring 77 prevent the cable 75 from interfering with travel of the collar 70 along the rod. While FIG. 9 depicts the biological host 76 as a person, advantages may be realized for animals, plants, or even individual organs and tissues in isolation that may be harvested for post-mortem analysis and subjected to infusion of a specimen 78. In short, the specimen 78 may be a single particle that generates a magnetic field and may be bound to a carrier 80. The specimen 78 is selected to exhibit a magnetic field H that is capable of being sensed by at least one of the SMMs 20A, 20B while the specimen 78 is within the host 76. The carrier 80 may be selected for its capability to selectively bind to a biological site of interest 82 within the host 76, as well as its ability to be bound to the specimen 78. Non-limiting examples of carriers 80 include naturally occurring and monoclonal antibodies (e.g., prostate secretory protein), high affinity bidentate ligands, and plant-derived substances such as betacarboline alkaloids, flavanones and flavonoids. Non-limiting examples of biological sites of interest 82 include cancer cells, enzymes, proteins, viruses, and bacteria. A compound or element that exhibits a magnetic field H as above that is also capable of selectively binding to a biological site of interest 82 may function as a specimen 78/carrier 80 combination. Illustrations of the specimen 78, carrier 80, and biological site of interest 82 are greatly enlarged in FIG. 9 for clarity. For example, the specimen 78 may measure on the order of about 1 cm or less.

In practice, a multitude of individual specimen 78/carrier 80 combinations is introduced into the host 76. For a living host, they may be ingested or injected as a liquid and dispersed through normal functions, or absorbed through the root system of plants. For post-mortem examination, they may be dispersed through a mechanical simulation of normal function (such as a heart driven by an external pump or electrical stimulation), or through differential pressure diffusion (such as through a liver or brain section). Other techniques may be apparent and known in the art. If an appropriate biological site of interest 82 is present within the host 76, at least some of the carriers 80 will bind to it. The host 76 is positioned on the table 74, and the SMMs 20A, 20B are moved along the rods 72 to scan the host 76 for specimens 78. Presence of specimens 78 within the host 76 reveal the presence of biological sites of interest 82 to which the specimens 78 are bound via the carriers 80. The SMMs 20A, 20B of the present invention are sufficiently sensitive to detect small concentrations of specimens 78, which may be used as an indicator of the size and density of, for example, a tumor. A plurality of such SMMs 20A, 20B may be used to construct a three-dimensional image of the exact locations of biological sites of interest 82, as well as the size, density, shape, and disposition of clusters of biological sites of interest 82.

There are various embodiments of SMMs 20A, 20B for the above application. Where an SMM 20B is disposed below the table 74, active height control as detailed above may not yield sufficient advantage. Where the table 74 is not interposed between the host 76 and the SMM, such as SMM 20A of FIG. 9, active height control means includes, for example, a telescopic mount 84 that allows the sensor 10 to follow contours along the surface 88 of the host 76. An optical microscope 34, radar, sonar, or other height sensing apparatus may be mounted to the collar 70 via a pivot 86. A feedback loop similar to the optical feedback loop 23A–C described above can be used to orient the optical microscope 34 based on the extension of the telescopic mount 84. The optical microscope 34 measures a height between the surface 88 of the host 76 and the sensor 10, which is used for both incrementally extending and retracting the telescopic mount 84 and for determining the position of the specimen 78 based on the intensity of the sensed magnetic field.

While the SMMs 20A, 20B of FIG. 9 depict translation along the length of rods 70 disposed lengthwise above and below the host 76, the present invention further contemplates translation across the lateral sides (e.g., adjacent to and parallel with the illustrated arm). Additionally, the rods 72 may be positionable laterally (e.g., host's left or right side), or the rods may span laterally and be positionable lengthwise (between the host's head and feet). Additionally or alternatively, the table 74 may be movable relative to the rods 72. Any of the above embodiments allows the SMMs 20A, 20B to be positioned at a location about the host 76 that is closest to a suspected location of a biological site of interest 82, thus enabling the greatest sensitivity by minimizing the distance between the sensor 10 and the specimen 78. To that end, the sensor 10 may preferably scan at a distance from the surface 88 of the host 76 as illustrated, or may be in contact with the surface 88 of the host 76. The SMMs 20A, 20B may each include a single sensor 10, and may include the conductive shield 21 and/or the low-forward voltage diodes as detailed above. Due to the sensitivity of the SMMs 20A, 20B of the present invention, a single sensor 10 may detect a single specimen 78 within a host 76. Such single sensors 10 can be re-used after cleaning. A single sensor may be one magnetic sensor disposed transversely with respect to a measurement axis. Alternatively, each SMM 20A, 20B for the application described with reference to FIG. 9 may include N magnetic sensors disposed transversely with respect to the measurement axis.

Preferably, the sensors 10 of the SMMs 20A, 20B for the biological application of FIG. 9 are MTJ sensors.

While described above in the context of various types of magnetic sensors, it has also been discovered that the magnetic sensor 10 of the SMM 20 may be an off-the-shelf read/write head used for a computer hard drive. For example, the resistance of the giant magnetoresistance read/write head is about 30 Ohm, and the sensor area is believed to be about 10 nm by about 0.2 micron. The scanning direction is made to be along the narrower side (i.e., the 10 nm side) of the head. Along this direction the spatial resolution can thus approach some tens of nanometers. As a comparison, the wire-width in state-of-the-art IC chips is about 100 nm. The magnetic sensor 10 in this embodiment is thus a giant magnetoresistance (GMR) read/write head having a sensing area facing the specimen and defined by a length (L) times a width (W), where W<L, where the read/write head is translated, relative to a surface of the specimen, such that the width is parallel to the translation direction. This embodiment thus may employ an off-the-shelf read/write head as an economic magnetic sensor for use in the SMM 20. However, for improved sensitivity and spatial resolution, it is preferred to employ small MTJ sensors, as described above, rather than the GMR read/write head.

Figure 10:
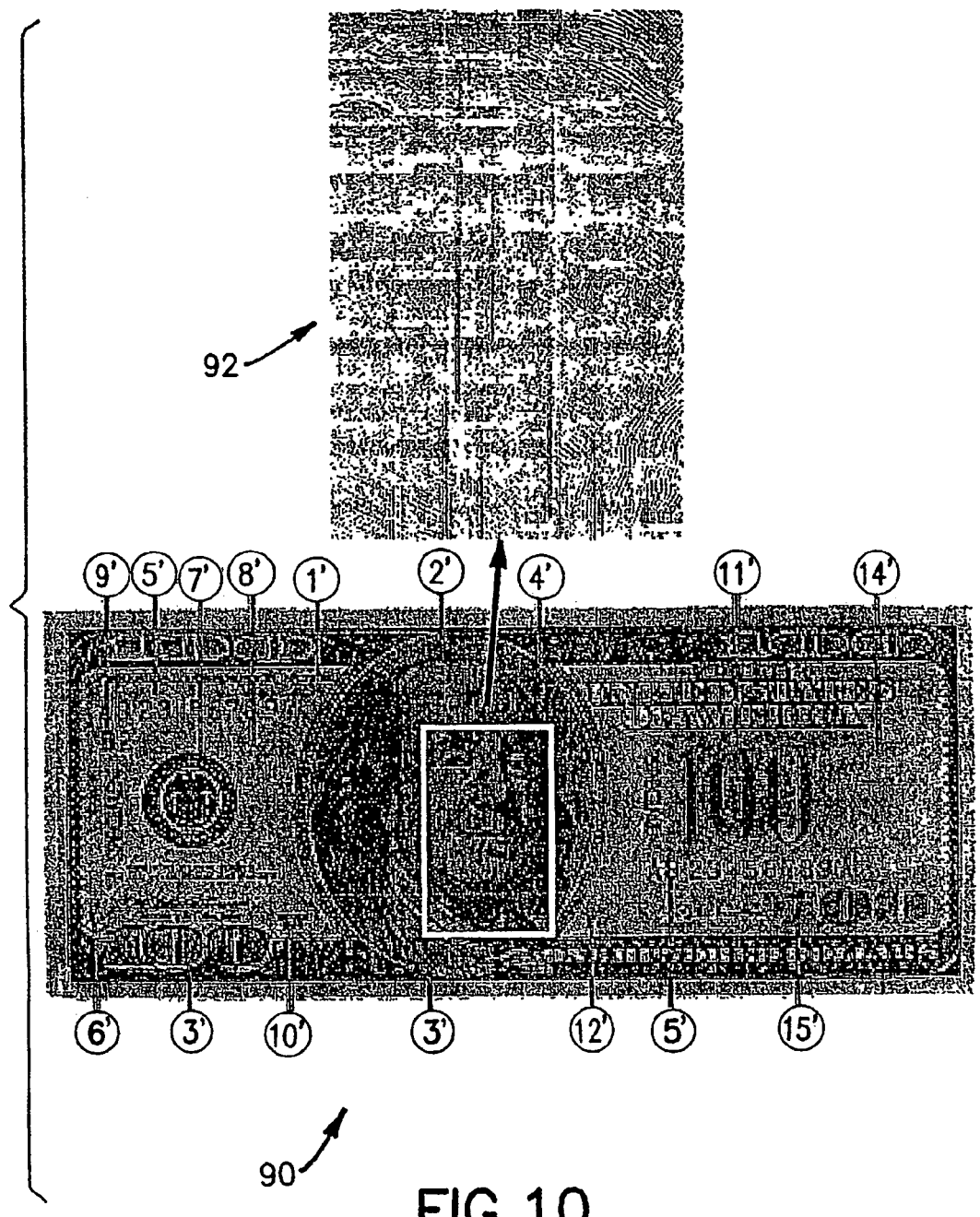
FIG. 10 shows a magnetic image obtained on a portion of a portrait on US$100 currency using the SMM equipped with an MTJ sensor.

While described in the context of the scanning magnetic microscope 20 that can be used to image integrated circuit features, magnetic media, and specimens bound to biological sites of interest within a host, the use of the scanning magnetic microscope is not limited to only these important applications. For example, the scanning magnetic microscope 10 may also be used to detect the presence of magnetic ink, such as ink used to print currency, for fraud detection and currency authentication. FIG. 10 shows the magnetic image 92 of a portion of the portrait on a specimen US $100 bill 90 using a SMM equipped with a MTJ sensor according to the present invention. The reference numbers 1'–15' refer to various portions of the bill 90 that may incorporate anti-fraud characteristics. The portrait 2 in the bill 90 is printed with magnetic ink that exhibits a magnetic field. Other portions of the bill 90 may also be printed with magnetic ink, or a magnetic spot 8', 14' that is not readily visible to the human eye may be embedded within the bill 90 for anti-fraud purposes. A magnetic sensor 10 according to the present invention, specifically an MTJ sensor, may be used to scan the magnetic ink and produce a two-dimensional image 92 as shown, a portion of the Franklin portrait obtained entirely using magnetic scanning of the magnetic ink. Preferably, such a sensor would be fixedly mounted within a bill-scanning apparatus and the bill 90 would be translated relative to the sensor to facilitate fast scanning of numerous bills 90.

Figure 11:
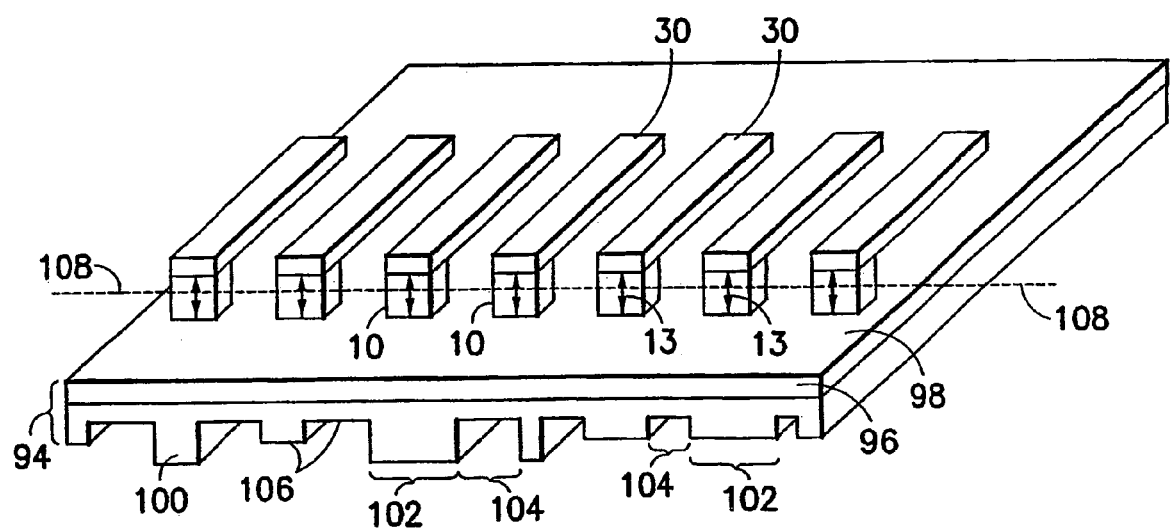
FIG. 11 depicts a plurality of sensors in a two-dimensional array disposed to scan an IC 'flip-chip' through the substrate on which the IC is made.

Another particularly valuable use for the magnetic sensors 10 of the present invention is magnetic imaging of integrated circuits from the substrate side. FIG. 11 is illustrative of this aspect. ICs 94 are built upon a substrate 96, typically silicon, so that an electronic overlay 100 through which current flows is bound to and supported by the substrate 96. The exposed substrate surface 98 is that surface of the substrate 96 that is opposite the electronic overlay 100. The electronic overlay 100 defines a plurality of channels 102 and troughs 104 that together define an active surface 106. Previously, ICs disposed lead lines only about a periphery of the IC, so the active surface 106 was largely if not completely unobstructed and accessible for investigative and analysis tools such as a sensor and SMM according to the present invention. More advanced ICs today dispose electrical leads across the active surface 106, and are sometimes referred to as 'flip-chips'. Measurement of electrical/magnetic characteristics within the channels 102 and troughs 104 of a flip-chip is obstructed both physically and electro-magnetically by the presence of the lead lines and related interconnects. It is estimated that nearly 30% of ICs produced today dispose lead lines across the active surface rather than only at the periphery, with that percentage expected to increase in future years as production costs decline.

The sensors 10 according to the present invention are sensitive enough to measure magnetic fields through the substrate 96. As depicted in FIG. 11, a plurality of magnetic sensors 10, each defining a single sensing unit with a sensing axis 13 that is perpendicular to the smooth exposed surface 98 of the substrate 96, are disposed to scan the IC through the substrate 96. Each sensor 10 is mounted on a cantilever arm 30 as previously detailed. The sensors 10 may preferably scan while in contact with the exposed surface 98, or alternatively may include active height control from the exposed surface 98, either each sensor 10 individually or the two-dimensional array of sensors 10 uniformly. Preferably, a current is applied to the IC being scanned by the sensors 10, in addition to a sense current applied to the sensors 10 themselves.

The sensors 10 are arranged to define a line 108 that is substantially parallel to a plane defined by the exposed surface 98. In the arrangement depicted in FIG. 11 wherein each sensor 10 defines only one sensing unit with the sensing axes 13 substantially perpendicular to the exposed surface 98, the line 108 defined by the sensors 10 is also perpendicular to the sensing axes 13. The inventors are unaware of any other apparatus that has the ability to scan a flip-chip 94 through the substrate 96, especially at ambient temperatures (e.g., about 300 K±25 K). Currently, flip-chips are analyzed using a SQUID (superconducting quantum interference device) probe adjacent to the active surface 106. SQUID probes operate at cryogenic temperatures (about 77 K and below). Initial experimentation has shown MTJ sensors are best adapted for scanning flip-chips 94 through the substrate 96.

Thus, while described in the context of presently disclosed embodiments and applications, it should be appreciated that these teachings should be given a scope commensurate with scope of the appended claims.

What is claimed is:

1. A scanning magnetic microscope, comprising:
   a magnetic sensor for sensing a magnetic field generated by a specimen; said magnetic sensor comprising at least two magnetic sensing units each defining a sensing axis, said sensing axes being disposed orthogonally to one another; and
   translation means for translating at least one of said magnetic sensor and said specimen relative to one another along a measurement axis that is not parallel to the sensing axis;
   further comprising means for maintaining said magnetic sensor in contact with a surface of said specimen during measurement.

2. A microscope according to claim 1, further comprising a set of N magnetic sensors disposed transversely with respect to said measurement axis, wherein N is an integer greater than one.

3. A microscope according to claim 2, in which said set of N magnetic sensors are disposed at about equal distances from one another along a transverse axis that is perpendicular to said measurement axis.

4. A microscope according to claim 1, further comprising a height control apparatus for actively maintaining said magnetic sensor at a measurement offset distance from a surface of said specimen during measurement.

5. A microscope according to claim 1, further comprising a wear-resistant coating on a contact surface of said sensors.

6. A microscope according to claim 5, in which said wear-resistant coating is selected from the group comprising amorphous carbon film and synthetic diamond film.

7. A microscope according to claim 1, further comprising a coating of lubricant between said sensor and said sample.

8. A microscope according to claim 1 further comprising a data processor, having an input coupled to an output of said magnetic sensor, for constructing an image of said magnetic field.

9. A scanning magnetic microscope, comprising:
   a magnetic sensor for sensing a magnetic field generated by a specimen; said magnetic sensor comprising at least two magnetic sensing units each defining a sensing axis, said sensing axes being disposed orthogonally to one another; and
   translation means for translating at least one of said magnetic sensor and said specimen relative to one another along a measurement axis that is not parallel to the sensing axis;
   further comprising a lubricant reservoir that is translated with said magnetic sensor.

10. A scanning magnetic microscope, comprising:
    a plurality of N magnetic sensors for sensing a magnetic field generated by a specimen; said N magnetic sensors disposed transversely with respect to a measurement axis, whereby said magnetic field may be sensed at N locations simultaneously, N being an integer greater than one; and
    translation means for translating at least one of said magnetic sensor and said specimen along a measurement axis relative to a surface of said specimen,
    wherein each of the N magnetic sensors comprise at least two magnetic sensing units each defining a sensing axis, said sensing axes of each magnetic sensor being disposed orthogonally, to one another;
    further comprising means for maintaining at least one of said magnetic sensors in contact with a surface of said specimen during measurement.

11. The scanning magnetic microscope of claim 10 wherein each of the N magnetic sensors comprise three magnetic sensing units each defining a sensing axis, said sensing axes of each magnetic sensor being disposed orthogonally to one another.

12. A microscope according to claim 10, in which said set of N magnetic sensors are disposed at about equal distances from one another along a transverse axis that is perpendicular to said measurement axis, and wherein the translation means further comprises means for stepping one of said specimen and at least one of said sensors transversely with respect to said measurement axis.

13. A microscope according to claim 10, further comprising a height control apparatus for actively maintaining at least one of said magnetic sensors at a measurement offset distance from a surface of said specimen during measurement.

14. A microscope according to claim 10, further comprising a wear-resistant coating on a contact surface of said sensors.

15. A microscope according to claim 14, in which said wear-resistant coating is selected from the group comprising amorphous carbon and synthetic diamond.

16. A microscope according to claim 10, further comprising a coating of lubricant between said sensor and said sample.

17. A microscope according to claim 10 further comprising a data processor, having an input coupled to an output of said magnetic sensor, for constructing an image of said magnetic field.

18. A scanning magnetic microscope, comprising:
a plurality of N magnetic sensors for sensing a magnetic field generated by a specimen; said N magnetic sensors disposed transversely with respect to a measurement axis, whereby said magnetic field may be sensed at N locations simultaneously, N being an integer greater than one; and
translation means for translating at least one of said magnetic sensor and said specimen along a measurement axis relative to a surface of said specimen,
wherein each of the N magnetic sensors comprise at least two magnetic sensing units each defining a sensing axis, said sensing axes of each magnetic sensor being disposed orthogonally to one another;
further comprising a lubricant reservoir that is translated with said magnetic sensor.

19. A method of measuring a magnetic field comprising:
providing a scanning magnetic microscope comprising at least one magnetic sensor, said sensor comprising at least two magnetic sensing units each defining a sensing axis, said sensing axes being disposed orthogonally to one another;
applying a sense current to the magnetic sensor;
translating the at least one sensor relative to a surface of a specimen along a measurement axis; and
maintaining at least one of said magnetic sensors in contact with a surface of said specimen during measurement.

20. The method of claim 19 wherein the scanning magnetic microscope comprises at least two magnetic sensors disposed along a line that is transverse to the measurement axis, and wherein translating comprises translating the at least two sensors simultaneously.

21. The method of claim 20 wherein translating the at least two sensors comprises operating means for independently translating said at least two sensors such that movement of one of said sensors in a height direction is independent of movement of at least one other of said sensors in the height direction, said height direction being perpendicular to said measurement axis.

* * * * *